United States Patent
Kim et al.

(10) Patent No.: US 11,616,065 B2
(45) Date of Patent: Mar. 28, 2023

(54) SEMICONDUCTOR MEMORY DEVICES

(71) Applicant: Samsung Electronics Co., Ltd., Suwon-si (KR)

(72) Inventors: Jiyoung Kim, Yongin-si (KR); Kiseok Lee, Hwaseong-si (KR); Bong-Soo Kim, Yongin-si (KR); Junsoo Kim, Seongnam-si (KR); Dongsoo Woo, Seoul (KR); Kyupil Lee, Seongnam-si (KR); HyeongSun Hong, Seongnam-si (KR); Yoosang Hwang, Suwon-si (KR)

(73) Assignee: Samsung Electronics Co., Ltd.

( * ) Notice: Subject to any disclaimer, the term of this patent is extended or adjusted under 35 U.S.C. 154(b) by 225 days.

(21) Appl. No.: 17/090,419

(22) Filed: Nov. 5, 2020

(65) Prior Publication Data

US 2021/0057416 A1  Feb. 25, 2021

Related U.S. Application Data

(63) Continuation of application No. 16/707,019, filed on Dec. 9, 2019, now Pat. No. 10,861,854, which is a (Continued)

(30) Foreign Application Priority Data

Nov. 20, 2017  (KR) .................. 10-2017-0155164

(51) Int. Cl.
  *H01L 27/108*  (2006.01)
  *H01L 27/06*  (2006.01)
  *H01L 49/02*  (2006.01)

(52) U.S. Cl.
  CPC .... *H01L 27/10805* (2013.01); *H01L 27/0688* (2013.01); *H01L 27/1085* (2013.01); *H01L 28/86* (2013.01)

(58) Field of Classification Search
  None
  See application file for complete search history.

(56) References Cited

U.S. PATENT DOCUMENTS 7,781,773 B2  8/2010  Thies et al.
8,207,032 B2  6/2012  Fischer et al.
(Continued)

FOREIGN PATENT DOCUMENTS

JP  H0864777 A  3/1996
JP  2014049765 A  3/2014
(Continued)

*Primary Examiner* — Jay C Chang
(74) *Attorney, Agent, or Firm* — Myers Bigel, P.A.

(57) ABSTRACT

Semiconductor memory devices are provided. A semiconductor memory device includes a substrate. The semiconductor memory device includes a plurality of memory cell transistors vertically stacked on the substrate. The semiconductor memory device includes a first conductive line connected to a source region of at least one of the plurality of memory cell transistors. The semiconductor memory device includes a second conductive line connected to a plurality of gate electrodes of the plurality of memory cell transistors. Moreover, the semiconductor memory device includes a data storage element connected to a drain region of the at least one of the plurality of memory cell transistors.

14 Claims, 50 Drawing Sheets

Related U.S. Application Data continuation of application No. 16/038,052, filed on Jul. 17, 2018, now Pat. No. 10,535,659.

(60) Provisional application No. 62/565,302, filed on Sep. 29, 2017.

(56) References Cited

U.S. PATENT DOCUMENTS

| | | | |
|---|---|---|---|
| 8,441,053 B2 | 5/2013 | Chen et al. | |
| 8,780,602 B2 | 7/2014 | Lue | |
| 9,240,441 B2 | 1/2016 | Yoon et al. | |
| 9,514,792 B2 | 12/2016 | Kajigaya | |
| 9,698,272 B1 | 7/2017 | Ikeda et al. | |
| 9,887,199 B2 | 2/2018 | Lim et al. | |
| 2010/0308390 A1* | 12/2010 | Puget | H01L 27/1085 257/E27.084 |
| 2012/0051137 A1* | 3/2012 | Hung | H01L 21/76838 365/185.17 |
| 2013/0161713 A1 | 6/2013 | Yamazaki et al. | |
| 2013/0270626 A1* | 10/2013 | Lue | H01L 27/0688 257/324 |
| 2014/0008711 A1 | 1/2014 | Park | |
| 2014/0054538 A1 | 2/2014 | Park | |
| 2014/0138778 A1 | 5/2014 | Kato | |
| 2014/0197469 A1 | 7/2014 | Lee et al. | |
| 2016/0027782 A1 | 1/2016 | Saito | |
| 2016/0064079 A1 | 3/2016 | Alsmeier | |
| 2016/0093686 A1 | 3/2016 | Yoon et al. | |
| 2016/0322368 A1 | 11/2016 | Sun et al. | |
| 2016/0336057 A1 | 11/2016 | Onuki et al. | |
| 2017/0053906 A1 | 2/2017 | Or-Bach et al. | |
| 2017/0092371 A1 | 3/2017 | Harari | |
| 2017/0221761 A1 | 8/2017 | Or-Bach et al. | |

FOREIGN PATENT DOCUMENTS

| | | |
|---|---|---|
| JP | 2017-28327 A | 2/2017 |
| JP | 2017168623 A | 9/2017 |
| KR | 10-2014-0007241 A | 1/2014 |

* cited by examiner

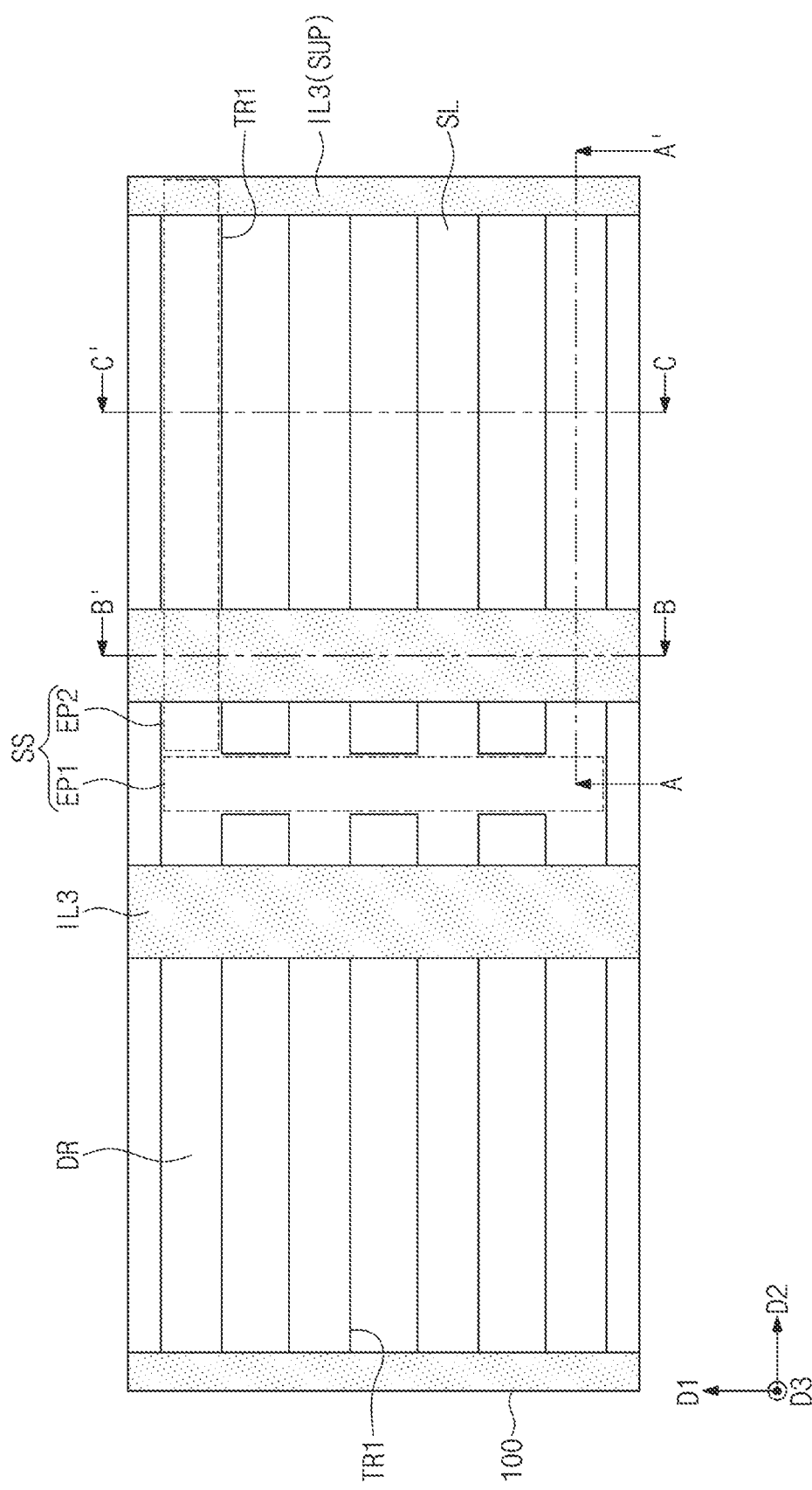

SEMICONDUCTOR MEMORY DEVICES

CROSS-REFERENCE TO RELATED APPLICATIONS

This application is a continuation application of and claims priority from U.S. patent application Ser. No. 16/707,019, filed Dec. 9, 2019, which is a continuation application of and claims priority from U.S. patent application Ser. No. 16/038,052, now U.S. Pat. No. 10,535,659, filed Jul. 17, 2018, which claims the benefit of U.S. Provisional Patent Application No. 62/565,302, filed Sep. 29, 2017, and priority under 35 U.S.C § 119 to Korean Patent Application No. 10-2017-0155164, filed Nov. 20, 2017 in the Korean Intellectual Property Office, the entire contents of each of the above applications is hereby incorporated herein by reference.

BACKGROUND

The present disclosure relates to semiconductor devices, and in particular, to highly-integrated three-dimensional semiconductor memory devices. Higher integration of semiconductor devices may be used to address consumer demands for superior performance and inexpensive prices. In the case of semiconductor devices, since their integration may be an important factor in determining product prices, increased integration is especially desirable. In the case of two-dimensional or planar semiconductor devices, since their integration is mainly determined by the area occupied by a unit memory cell, integration can be greatly influenced by the level of a fine pattern forming technology. However, the expensive process equipment used to increase pattern fineness sets a practical limitation on increasing integration for two-dimensional or planar semiconductor devices. To overcome such a limitation, three-dimensional semiconductor memory devices including three-dimensionally arranged memory cells have recently been proposed.

SUMMARY

Some embodiments of present inventive concepts provide a highly integrated three-dimensional semiconductor memory device.

According to some embodiments of present inventive concepts, a semiconductor memory device may include a substrate. The semiconductor memory device may include a plurality of memory cell transistors vertically stacked on the substrate. The semiconductor memory device may include a first conductive line connected to a source region of at least one of the plurality of memory cell transistors. The semiconductor memory device may include a second conductive line connected to a plurality of gate electrodes of the plurality of memory cell transistors. Moreover, the semiconductor memory device may include a data storage element connected to a drain region of the at least one of the plurality of memory cell transistors. The data storage element may include a first electrode that extends horizontally from the drain region in a first direction parallel to a top surface of the substrate. A first one of the first conductive line or the second conductive line may extend horizontally in a second direction that intersects the first direction. A second one of the first conductive line or the second conductive line may extend vertically in a third direction that is perpendicular to the top surface of the substrate.

According to some embodiments of present inventive concepts, a semiconductor memory device may include a substrate. The semiconductor memory device may include a plurality of structures that are vertically spaced apart from each other in a stack on the substrate. One of the plurality of structures may include a semiconductor pattern that includes a first impurity region, a channel region, and a second impurity region. The one of the plurality of structures may include a first electrode of a capacitor that is connected to the second impurity region. Each of the plurality of structures may extend horizontally in a first direction that is parallel to a top surface of the substrate.

According to some embodiments of present inventive concepts, a semiconductor memory device may include a substrate. The semiconductor memory device may include a vertical stack including a plurality of layers on the substrate. The semiconductor memory device may include a first conductive line that is penetrated by the vertical stack and that extends in a vertical direction perpendicular to a top surface of the substrate. Each of the plurality of layers of the vertical stack may include a first extended portion that extends horizontally in a first direction parallel to the top surface of the substrate, and a second extended portion that extends horizontally from the first extended portion in a second direction parallel to the top surface of the substrate and crossing the first direction. The first extended portion may include a second conductive line. The second extended portion may include a semiconductor pattern and an electrode that is connected to the semiconductor pattern. The semiconductor pattern may be between the second conductive line and the electrode. Moreover, the first conductive line may be on a top surface and a bottom surface of the semiconductor pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 13, 15, 17, 19, 21, 23, 25, 27, 29 and 31 are plan views illustrating a method of fabricating a three-dimensional semiconductor memory device, according to some embodiments of present inventive concepts.

It should be noted that these figures are intended to illustrate the general characteristics of methods, structure, and/or materials utilized in example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of molecules, layers, regions, and/or structural elements may be reduced or exaggerated for clarity. The use of similar or identical reference numbers in the various drawings is intended to indicate the presence of a similar or identical element or feature.

DETAILED DESCRIPTION

Figure 1:
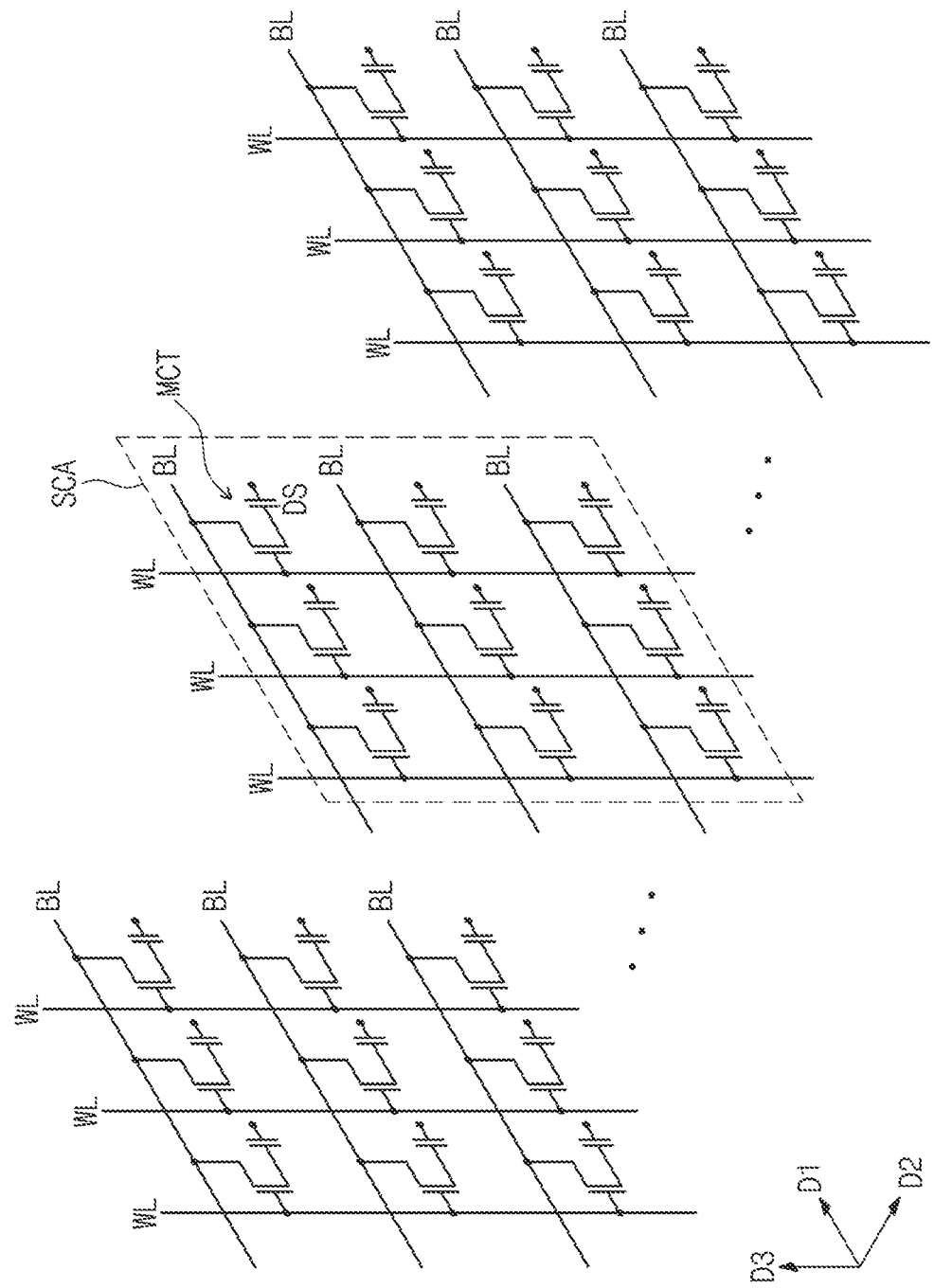
FIG. 1 is a circuit diagram schematically illustrating a cell array of a three-dimensional semiconductor memory device according to some embodiments of present inventive concepts.

FIG. 1 is a circuit diagram schematically illustrating a cell array of a three-dimensional semiconductor memory device according to some embodiments of present inventive concepts.

Referring to FIG. 1, a cell array of a three-dimensional semiconductor memory device may include a plurality of sub-cell arrays SCA. The sub-cell arrays SCA may be arranged in a second direction D2.

Each of the sub-cell arrays SCA may include a plurality of bit lines BL, a plurality of word lines WL, and a plurality of memory cell transistors MCT. Each of the memory cell transistors MCT may be placed between a corresponding one of the word lines WL and a corresponding one of the bit lines BL.

The bit lines BL may be conductive patterns (e.g., metal lines), which are spaced apart from, or stacked on, a substrate. The bit lines BL may extend in a first direction D1. The bit lines BL in each of the sub-cell arrays SCA may be spaced apart from each other in a vertical direction (e.g., a third direction D3).

The word lines WL may be conductive patterns (e.g., metal line) extending from the substrate in the vertical direction (e.g., in the third direction D3). The word lines WL in each of the sub-cell arrays SCA may be spaced apart from each other in the first direction D1.

A gate electrode/region of the memory cell transistor MCT may be connected to the word line WL, and a source electrode/region of the memory cell transistor MCT may be connected to the bit line BL. Each of the memory cell transistors MCT may include a capacitor (or other data storage element) DS. For example, a drain electrode/region of the memory cell transistor MCT may be connected to the capacitor DS.

Figure 2:
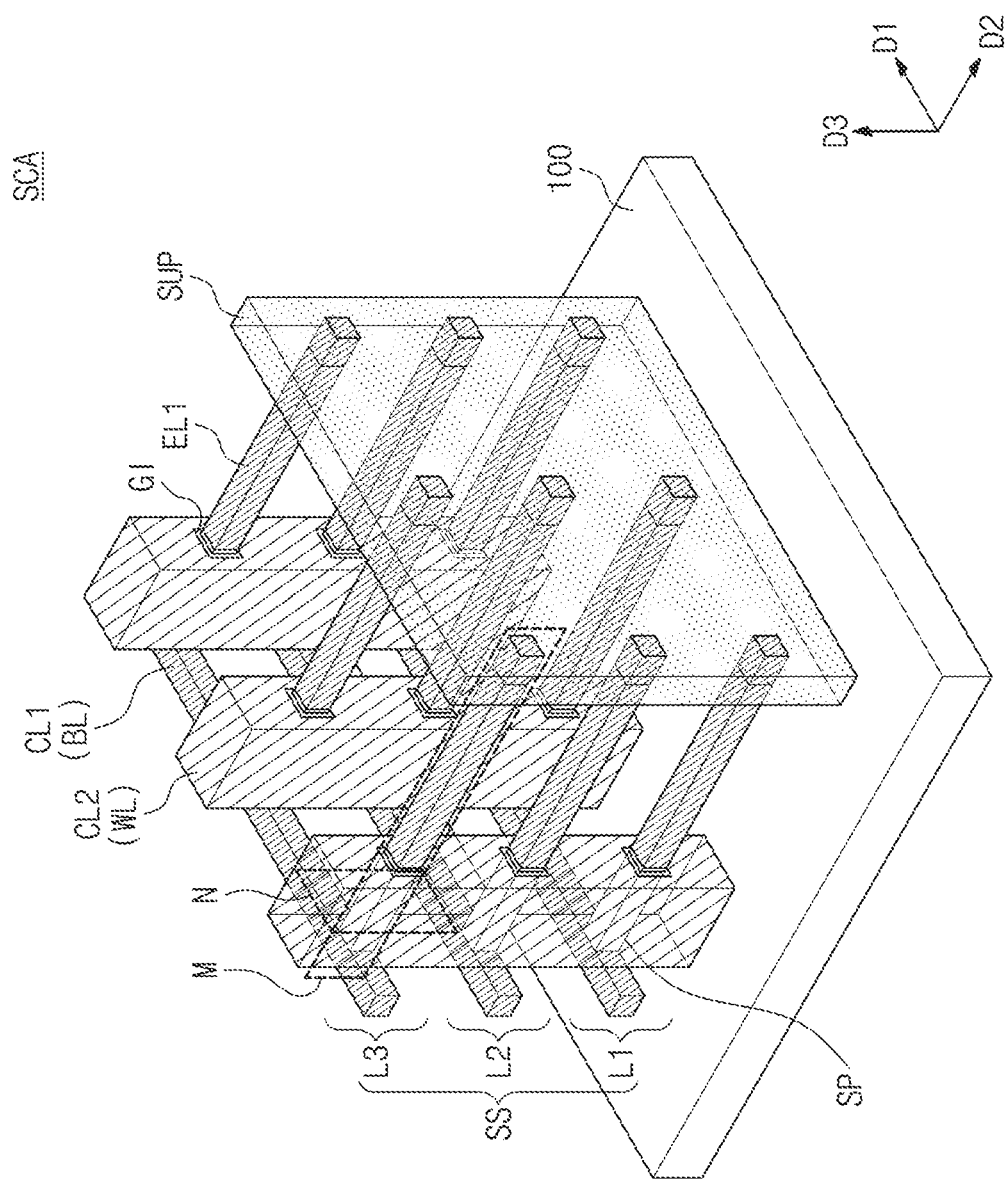
FIG. 2 is a perspective view illustrating a three-dimensional semiconductor memory device according to some embodiments of present inventive concepts.
Figure 3A:
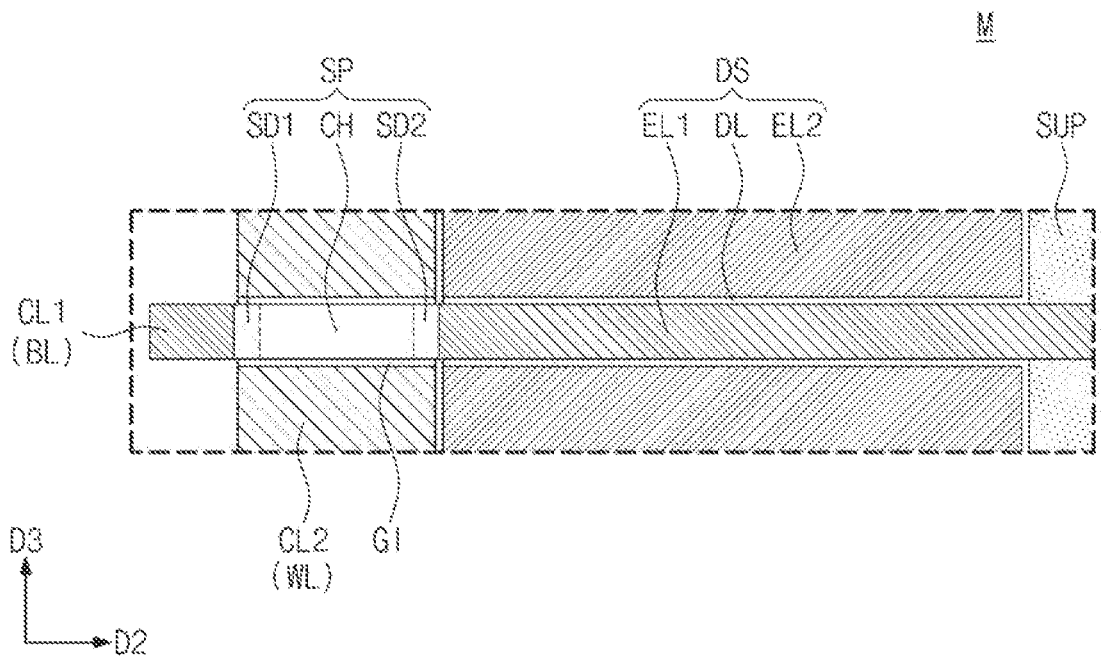
FIG. 3A is a sectional view illustrating a portion 'M' of FIG. 2.
Figure 3B:
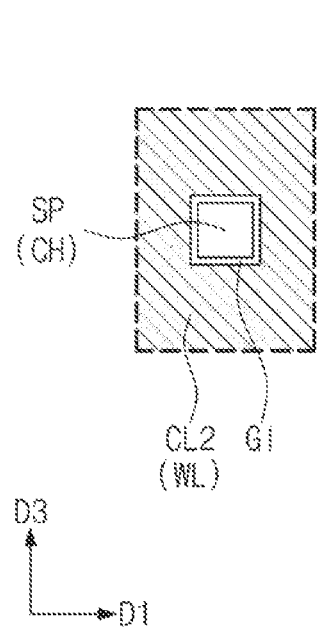
FIG. 3B is a sectional view illustrating a portion 'N' of FIG. 2.

FIG. 2 is a perspective view illustrating a three-dimensional semiconductor memory device according to some embodiments of present inventive concepts. FIG. 3A is a sectional view illustrating a portion 'M' of FIG. 2. FIG. 3B is a sectional view illustrating a portion 'N' of FIG. 2.

Referring to FIGS. 1, 2, 3A, and 3B, one of the sub-cell arrays SCA described with reference to FIG. 1 may be provided on a substrate 100. The substrate 100 may be a silicon substrate, a germanium substrate, or a silicon-germanium substrate.

In detail, a stack SS including first to third layers L1, L2, and L3 may be provided on the substrate 100. The first to third layers L1, L2, and L3 of the stack SS may be stacked to be spaced apart from each other in a vertical direction (i.e., in the third direction D3). Accordingly, the stack SS may be referred to herein as a "vertical stack." Each of the first to third layers L1, L2, and L3 may include a plurality of semiconductor patterns SP, a plurality of first electrodes EL1, and a first conductive line CL1.

Each of the semiconductor patterns SP may extend from the first conductive lines CL1 in the second direction D2 and may have a line shape, a bar shape, or a pillar shape. As an example, the semiconductor patterns SP may be formed of or include silicon, germanium, or silicon germanium. Each of the semiconductor patterns SP may include a channel region CH, a first impurity region SD1, and a second impurity region SD2.

The channel region CH may be interposed between the first and second impurity regions SD1 and SD2. The channel region CH may be used as a channel region of the memory cell transistor MCT described with reference to FIG. 1. The first and second impurity regions SD1 and SD2 may be used as the source and drain electrodes/regions of the memory cell transistor MCT described with reference to FIG. 1. The first and second impurity regions SD1 and SD2 may be impurity-doped regions which are formed by injecting impurities into the semiconductor pattern SP. For example, the first and second impurity regions SD1 and SD2 may have an n- or p-type conductivity.

The first electrodes EL1 may be connected to end portions of the semiconductor patterns SP, respectively. For example, the first electrodes EL1 may be connected to the second impurity regions SD2 of the semiconductor patterns SP, respectively. As used herein, the term "connected" may refer to a physical connection and/or an electrical connection. For example, in some embodiments, a first electrode EL1 may directly, physically contact a second impurity region SD2 (e.g., a drain electrode/region). The first electrodes EL1 may extend from the semiconductor patterns SP in a horizontal (i.e., lateral) direction such as the second direction D2. Each of the first electrodes EL1 may have a line shape, a bar shape, or a pillar shape.

A first end portion (e.g., a proximal end portion) of each of the first electrodes EL1 may be adjacent and connected to the second impurity region SD2 of the semiconductor pattern SP, and a second end portion (e.g., a distal end portion) of each of the first electrodes EL1 may be adjacent and connected to a supporting layer SUP. The second end portion of the first electrode EL1 may be opposite to the first end portion of the first electrode EL1. Accordingly, it may be possible to define an imaginary line connecting (e.g., an axis extending through) the first and second end portions of each of the first electrodes EL1. The imaginary line may extend parallel to a top surface of the substrate 100. The imaginary line may be parallel to the second direction D2. The imaginary line may be an extension axis of the first electrode EL1. Furthermore, each of the semiconductor patterns SP may have an extension axis parallel to the second direction D2. The extension axes of the semiconductor pattern SP and the first electrode EL1 connected to the semiconductor pattern SP may be coaxial/concentric to each other.

The supporting layer SUP may be configured to structurally support the first electrode EL1 or to inhibit/prevent the first electrode EL1 from being deformed or bent. The supporting layer SUP may be connected in common to a plurality of the first electrodes EL1. The supporting layer SUP may be formed of or include at least one of various insulating materials (e.g., silicon oxide, silicon nitride, or silicon oxynitride).

Each of the first conductive lines CL1 may have a line or bar shape extending in the first direction D1. The first conductive lines CL1 may be stacked to be spaced apart from each other in the third direction D3. The first conductive lines CL1 may be formed of or include at least one of various conductive materials. For example, the conductive materials may include one of doped semiconductor materials (e.g., doped silicon, doped germanium, and so forth), conductive metal nitrides (e.g., titanium nitride, tantalum nitride, and so forth), metals (e.g., tungsten, titanium, tantalum, and so forth), and/or metal-semiconductor compounds (tungsten silicide, cobalt silicide, titanium silicide, and so forth). The first conductive lines CL1 may be used as the bit lines BL described with reference to FIG. 1.

The first layer L1 will be described in detail as a representative example of the first to third layers L1, L2 and L3. The semiconductor patterns SP of the first layer L1 may be arranged to be spaced apart from each other in the first direction D1. The semiconductor patterns SP of the first layer L1 may be provided at the same level (e.g., a first level). The first conductive line CL1 of the first layer L1 may be connected to the first impurity regions SD1 of the semiconductor patterns SP of the first layer L1. In other words, the first conductive line CL1 of the first layer L1 may be provided to connect the first impurity regions SD1 and to extend in the first direction D1. As an example, the first conductive line CL1 may be located at the first level, at which the semiconductor patterns SP are located.

The first electrodes EL1 of the first layer L1 may extend from the semiconductor patterns SP of the first layer L1 in a horizontal direction such as the second direction D2. The first electrodes EL1 of the first layer L1 may be arranged to be spaced apart from each other in the first direction D1. The first electrodes EL1 of the first layer L1 may be provided at the same level (e.g., the first level). In some embodiments, a first electrode EL1 of the first layer L1 may have an upper surface or a lower surface that is coplanar with an upper surface or a lower surface of the semiconductor pattern SP of the first layer L1. The first electrodes EL1 may be formed of or include at least one of various conductive materials (e.g., doped semiconductor materials, conductive metal nitrides, metals, or metal-semiconductor compounds). The first electrodes EL1 may include substantially the same material as that of the first conductive line CL1.

Each of the second layer L2 and the third layer L3 may be configured to have substantially the same features as the first layer L1. However, the first conductive line CL1, the semiconductor patterns SP, and the first electrodes EL1 of the second layer L2 may be located at a second level higher than the first level, and the first conductive line CL1, the semiconductor patterns SP, and the first electrodes EL1 of the third layer L3 may be located at a third level higher (in the third direction D3) than the second level.

Referring again to FIG. 3A, a dielectric layer DL may be provided on (e.g., to cover) surfaces of the first electrodes EL1 of the stack SS. The dielectric layer DL may have a uniform thickness on the surface of the first electrode EL1. For example, the dielectric layer DL may be formed of or include at least one of metal oxides (e.g., hafnium oxide, zirconium oxide, aluminum oxide, lanthanum oxide, tantalum oxide, and titanium oxide) or perovskite dielectric materials (e.g., $SrTiO_3$(STO), $(Ba,Sr)TiO_3$(BST), $BaTiO_3$, PZT, and PLZT).

A second electrode EL2 may be provided on the dielectric layer DL. The second electrode EL2 may be provided around a perimeter/periphery of (e.g., to surround) the first electrodes EL1. The second electrode EL2 may be formed of or include at least one of conductive materials (e.g., doped semiconductor materials, conductive metal nitrides, metals, or metal-semiconductor compounds). Each of the first electrodes EL1, the dielectric layer DL, and the second electrode EL2 may constitute the capacitor DS. The capacitor DS may be used as a memory element for storing data.

Referring again to FIGS. 1, 2, 3A, and 3B, second conductive lines CL2 may be provided on the substrate 100 to penetrate the stack SS. Each of the second conductive lines CL2 may have a line shape, a bar shape, or a pillar shape extending in the third direction D3. The second conductive lines CL2 may be arranged to be spaced apart from each other in the first direction D1.

Each of the second conductive lines CL2 may be provided to extend in the vertical direction (i.e., the third direction D3) and to wrap around (e.g., to surround a periphery of) the semiconductor patterns SP, which are vertically stacked on the substrate 100. The second conductive line CL2 may be provided on (e.g., to cover) a top surface, a bottom surface, and opposite side surfaces of the semiconductor pattern SP (e.g., see FIG. 3B). A gate insulating layer GI may be interposed between the second conductive line CL2 and the semiconductor pattern SP. For example, the memory cell transistor MCT may be a gate-all-around type transistor.

The gate insulating layer GI may be formed of or include at least one of high-k dielectric materials, silicon oxide, silicon nitride, or silicon oxynitride and may have a single- or multi-layer structure. For example, the high-k dielectric material may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

As an example, a first one of the second conductive lines CL2 may be provided to surround a periphery of a first one of the semiconductor patterns SP of the first layer L1, a first one of the semiconductor patterns SP of the second layer L2, and a first one of the semiconductor patterns SP of the third layer L3. A second one of the second conductive lines CL2 may be provided to surround a periphery of a second one of the semiconductor patterns SP of the first layer L1, a second one of the semiconductor patterns SP of the second layer L2, and a second one of the semiconductor patterns SP of the third layer L3.

The second conductive lines CL2 may be formed of or include at least one of conductive materials (e.g., doped semiconductor materials, conductive metal nitrides, metals, or metal-semiconductor compounds). The second conductive lines CL2 may be used as the word lines WL described with reference to FIG. 1.

The first one of the semiconductor patterns SP in the first layer L1 and a first one of the first electrodes EL1 in the first layer L1 may constitute a first structure. The first one of the semiconductor patterns SP in the second layer L2 and a first one of the first electrodes EL1 in the second layer L2 may constitute a second structure. The first one of the semiconductor patterns SP in the third layer L3 and a first one of the first electrodes EL1 in the third layer L3 may constitute a third structure. The first to third structures may be stacked to be spaced apart from each other in the vertical direction. The first to third structures may overlap each other in the vertical direction (i.e., the third direction D3). Each of the first to third structures may have a line shape, a bar shape, or a pillar shape extending in the second direction D2. Each of the second conductive lines CL2 may be provided to surround a periphery of the semiconductor patterns SP of the first to third structures.

Empty spaces in the stack SS may include (e.g., be filled with) an insulating material. For example, the insulating material may be formed of or include at least one of silicon oxide, silicon nitride, or silicon oxynitride.

According to some embodiments of present inventive concepts, a three-dimensional semiconductor memory device may include the memory cell transistors MCT, which are three-dimensionally arranged on the substrate 100, and the first electrodes EL1, which are respectively connected to the memory cell transistors MCT and extend horizontally to serve as the capacitors DS. Thus, it is possible to increase an integration density or capacity of a memory device, compared with the conventional memory device including memory cell transistors, which are two-dimensionally arranged on a substrate, and first electrodes, which are respectively connected thereto and are vertically extended to serve as capacitors.

Figure 4:
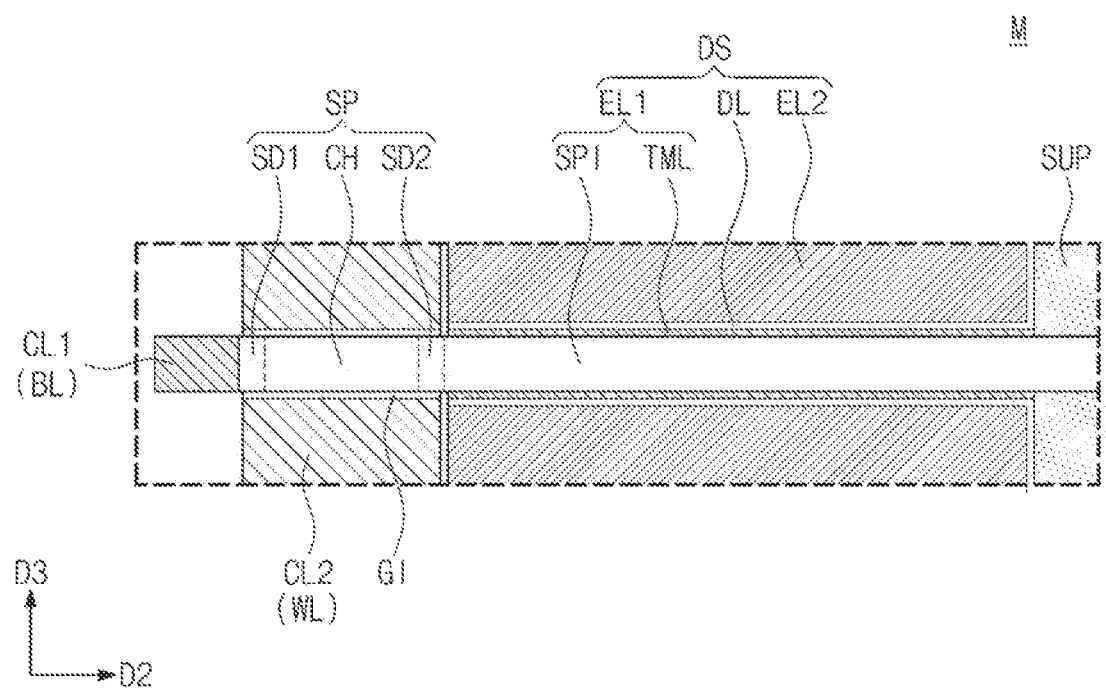
FIG. 4 is a sectional view illustrating a portion (e.g., the portion 'M' of FIG. 2) of a three-dimensional semiconductor memory device according to some embodiments of present inventive concepts.

FIG. 4 is a sectional view illustrating a portion (e.g., the portion 'M' of FIG. 2) of a three-dimensional semiconductor memory device according to some embodiments of present inventive concepts. For concise description, an element previously described with reference to FIGS. 1, 2, 3A, and 3B may be identified by the same reference number without repeating an overlapping description thereof.

Referring to FIGS. 1, 2, 3B, and 4, each of the first electrodes EL1 may include a semiconductor pillar SPI and a conductive layer TML, which is provided around a perimeter of (e.g., to surround a surface of) the semiconductor pillar SPI. For example, the conductive layer TML may be provided to conformally cover the surface of the semiconductor pillar SPI. The dielectric layer DL may be provided on the conductive layer TML.

The semiconductor pillar SPI may be a pillar-shaped pattern extending from the semiconductor pattern SP in a horizontal direction such as the second direction D2. The semiconductor pillar SPI and the semiconductor pattern SP may be connected to constitute a single body. The semiconductor pillar SPI may be formed of or include the same semiconductor material as that of the semiconductor pattern SP. For example, the semiconductor pillar SPI may include a doped semiconductor material. The conductive layer TML may be formed of or include at least one of conductive metal nitrides, metals, or metal-semiconductor compounds.

Figure 5:
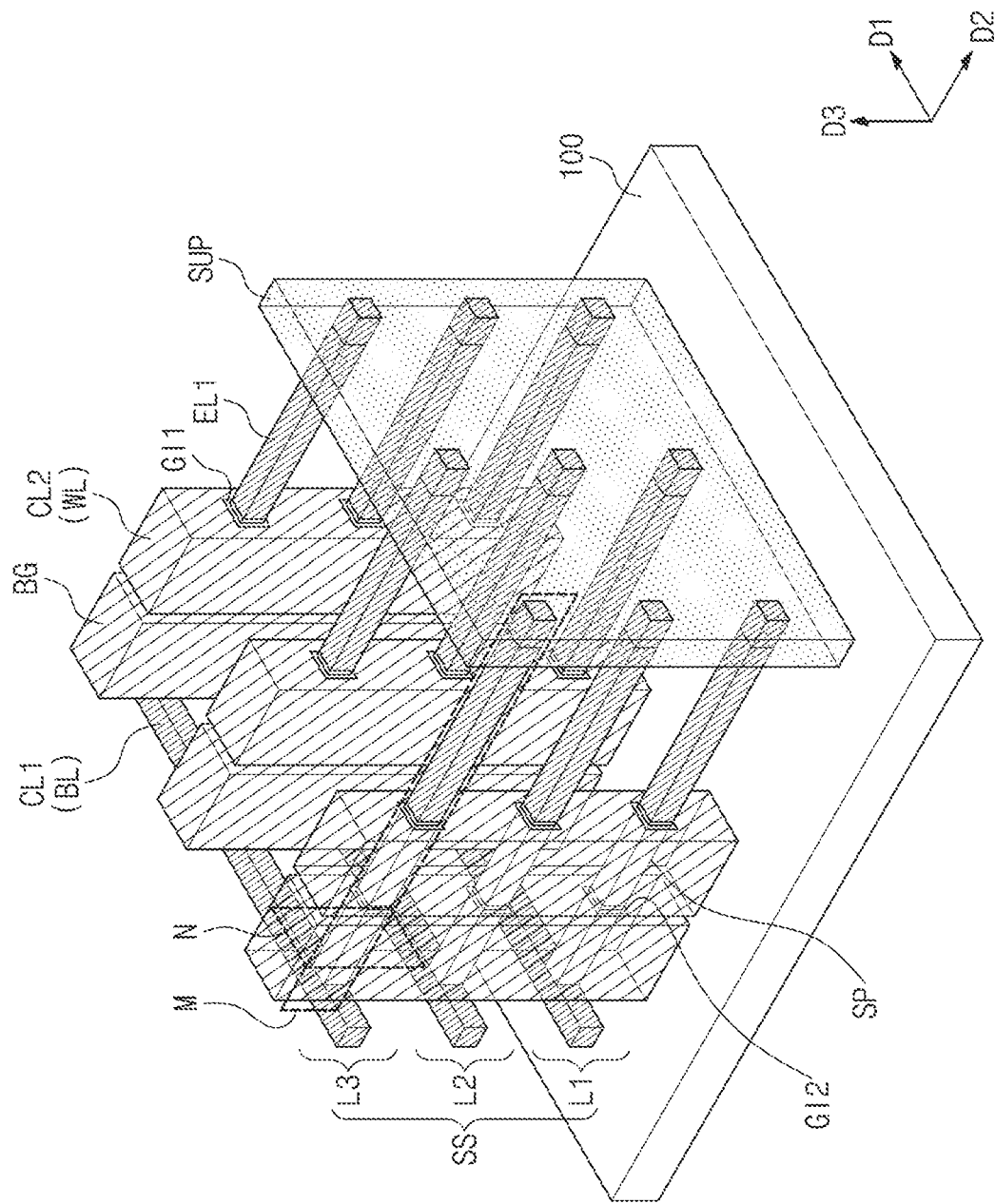
FIG. 5 is a perspective view illustrating a three-dimensional semiconductor memory device according to some embodiments of present inventive concepts.
Figure 6A:
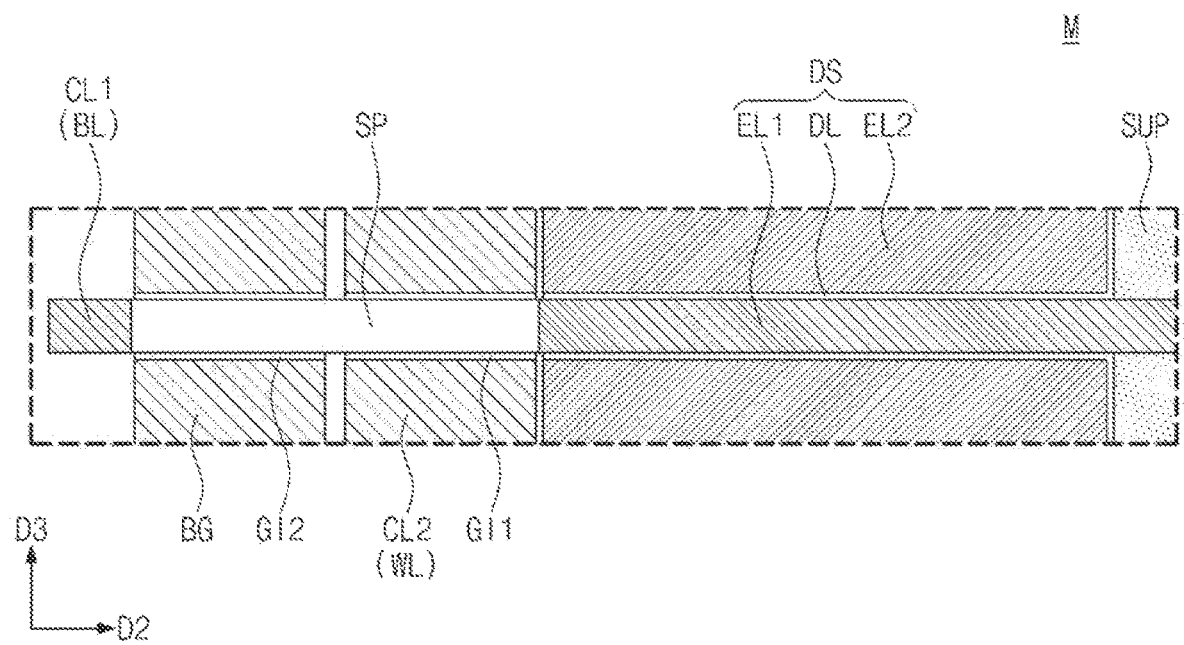
FIG. 6A is a sectional view illustrating a portion 'M' of FIG. 5.
Figure 6B:
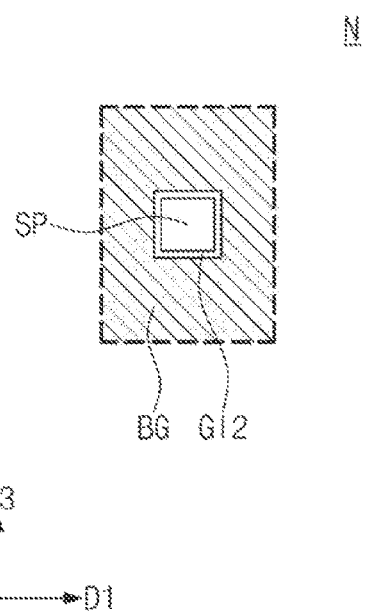
FIG. 6B is a sectional view illustrating a portion 'N' of FIG. 5.

FIG. 5 is a perspective view illustrating a three-dimensional semiconductor memory device according to some embodiments of present inventive concepts. FIG. 6A is a sectional view illustrating a portion 'M' of FIG. 5. FIG. 6B is a sectional view illustrating a portion 'N' of FIG. 5. For concise description, an element previously described with reference to FIGS. 1, 2, 3A, and 3B may be identified by the same reference number without repeating an overlapping description thereof.

Referring to FIGS. 1, 5, 6A, and 6B, back-gate lines BG may be provided on the substrate 100 to penetrate the stack SS. Each of the back-gate lines BG may have a line shape, a bar shape, or a pillar shape extending in the third direction D3. The back-gate lines BG may be arranged to be spaced apart from each other in the first direction D1.

Each of the back-gate lines BG and the second conductive line CL2 adjacent thereto may be spaced apart from each other in the second direction D2. The back-gate line BG and the second conductive line CL2 adjacent thereto may be provided to define a perimeter around (e.g., to surround a periphery of) the semiconductor pattern SP. The back-gate line BG may be provided to face a top surface, a bottom surface, and opposite side surfaces of the semiconductor pattern SP (e.g., see FIG. 6B).

A first gate insulating layer GI1 may be interposed between the second conductive line CL2 and the semiconductor pattern SP, and a second gate insulating layer GI2 may be interposed between the back-gate line BG and the semiconductor pattern SP. The second gate insulating layer GI2 may be formed of or include at least one of high-k dielectric materials, silicon oxide, silicon nitride, or silicon oxynitride and may be provided to have a single- or multi-layer structure.

In embodiments where the memory cell transistor MCT is an NMOS transistor, holes may be accumulated in a portion of the semiconductor pattern SP, which is used as the channel region thereof. The back-gate line BG may be used to discharge the holes, which are accumulated in the semiconductor pattern SP, to the first conductive line CL1. By virtue of this discharging operation, it may be possible to stabilize electric characteristics of the memory cell transistor MCT.

Figure 7:
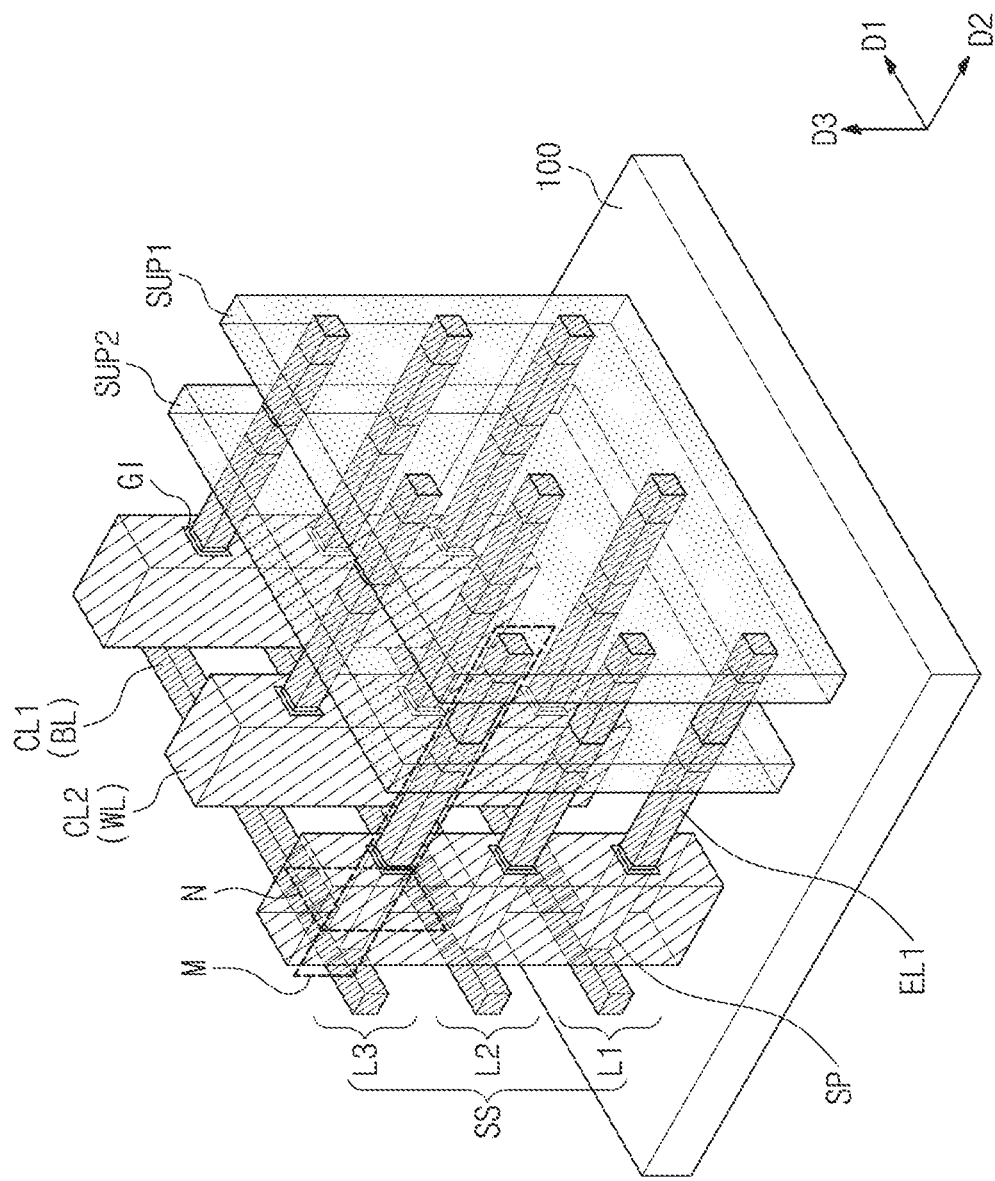
FIG. 7 is a perspective view illustrating a three-dimensional semiconductor memory device according to some embodiments of present inventive concepts.
Figure 8:
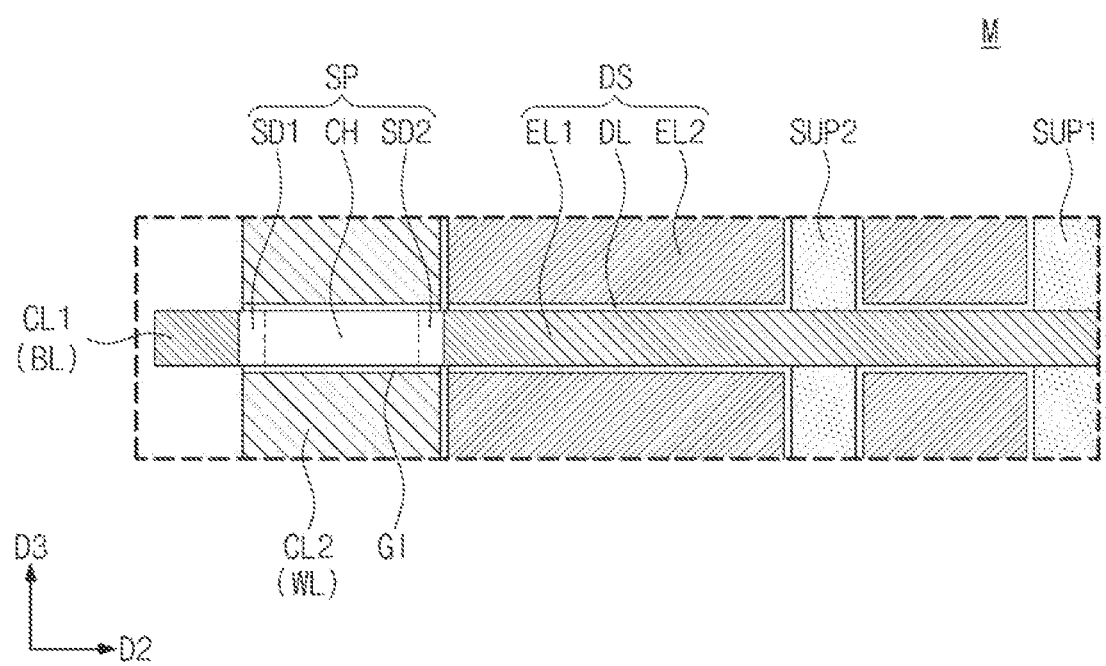
FIG. 8 is a sectional view illustrating a portion 'M' of FIG. 7.

FIG. 7 is a perspective view illustrating a three-dimensional semiconductor memory device according to some embodiments of present inventive concepts. FIG. 8 is a sectional view illustrating a portion 'M' of FIG. 7. For concise description, an element previously described with reference to FIGS. 1, 2, 3A, and 3B may be identified by the same reference number without repeating an overlapping description thereof.

Referring to FIGS. 1, 7, and 8, a first supporting layer SUP1 and a second supporting layer SUP2 may be provided on the substrate 100. The first and second supporting layers SUP1 and SUP2 may be connected to the first electrodes EL1 of the stack SS and may be used to structurally support the first electrodes EL1 of the stack SS. The first supporting layer SUP1 may be connected to the second end portions of the first electrodes ELL and the second supporting layer SUP2 may be connected to middle portions of the first electrodes EL1 (e.g., between the first and second end portions of the first electrodes EL1). Each of the first and second supporting layers SUP1 and SUP2 may include at least one of silicon oxide, silicon nitride, or silicon oxynitride, independently.

Figure 9:
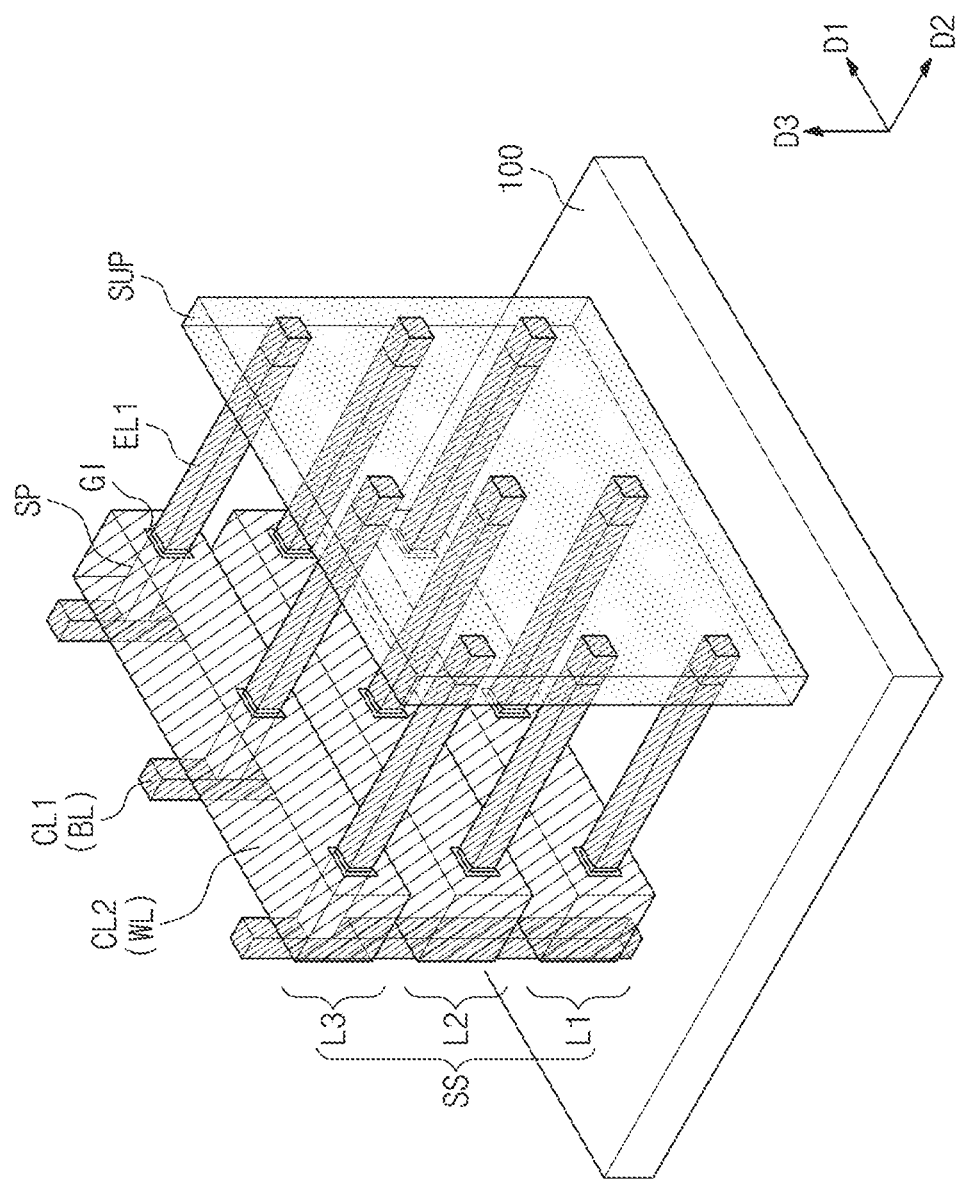
FIG. 9 is a perspective view illustrating a three-dimensional semiconductor memory device according to some embodiments of present inventive concepts.

FIG. 9 is a perspective view illustrating a three-dimensional semiconductor memory device according to some embodiments of present inventive concepts. For concise description, an element previously described with reference to FIGS. 1, 2, 3A, and 3B may be identified by the same reference number without repeating an overlapping description thereof.

Referring to FIG. 9, each of the first conductive lines CL1 may be provided to have a line shape, a bar shape, or a pillar shape extending in the third direction D3. The first conductive line CL1 may extend vertically to connect vertically-stacked ones of the semiconductor patterns SP to each other. Each of the second conductive lines CL2 may be provided to have a line shape, a bar shape, or a pillar shape extending in the first direction D1. Each of the second conductive lines CL2 may extend horizontally to define a perimeter around (e.g., to surround a periphery of) the semiconductor patterns SP, which are horizontally arranged in a corresponding one of the layers L1, L2, L3.

In the semiconductor memory device according to the example of FIG. 9, the bit lines BL (i.e., the first conductive lines CL1) may be vertically extended and the word lines WL (i.e., the second conductive lines CL2) may be horizontally extended, unlike the semiconductor memory device described with reference to FIGS. 1, 2, 3A, and 3B. In the semiconductor memory device according to the example of FIG. 9, the semiconductor pattern SP and the first electrode EL1 may extend from the first conductive line CL1 in a horizontal direction (e.g., in the second direction D2).

Figure 10:
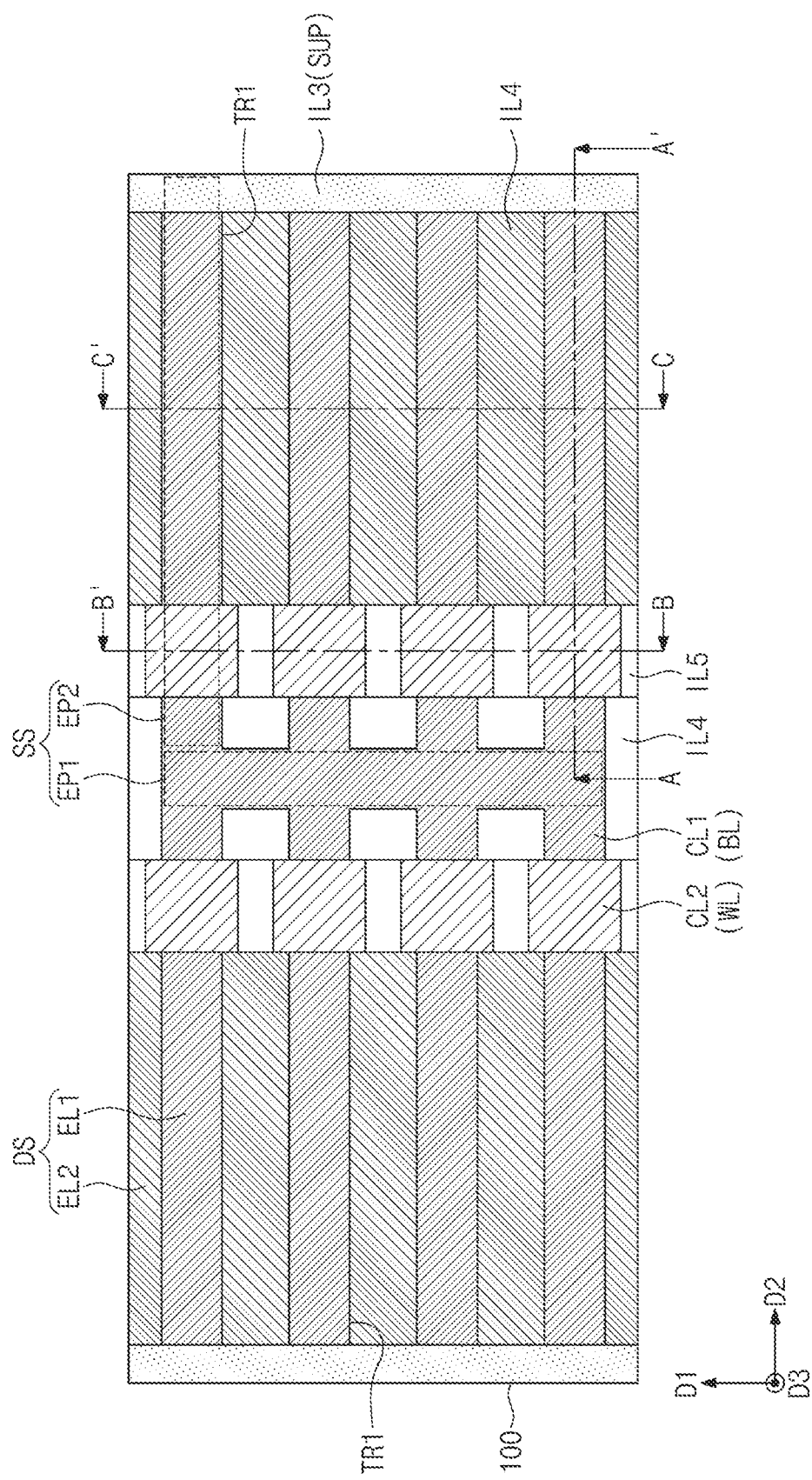
FIG. 10 is a plan view illustrating a three-dimensional semiconductor memory device according to some embodiments of present inventive concepts.
Figure 11A:
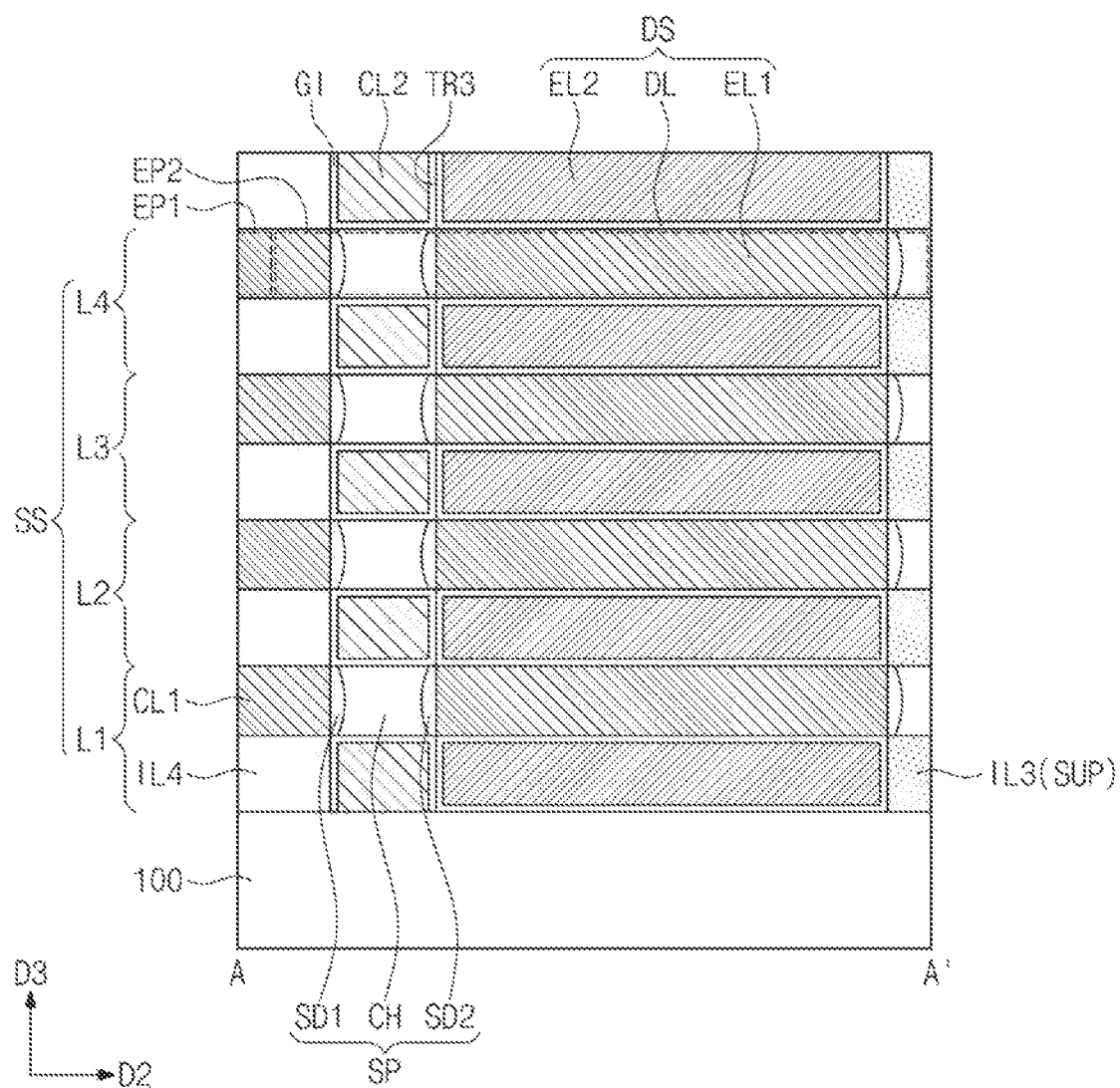
FIGS. 11A, 11B, and 11C are sectional views taken along lines A-A', B-B', and C-C', respectively, of FIG. 10.
Figure 11B:
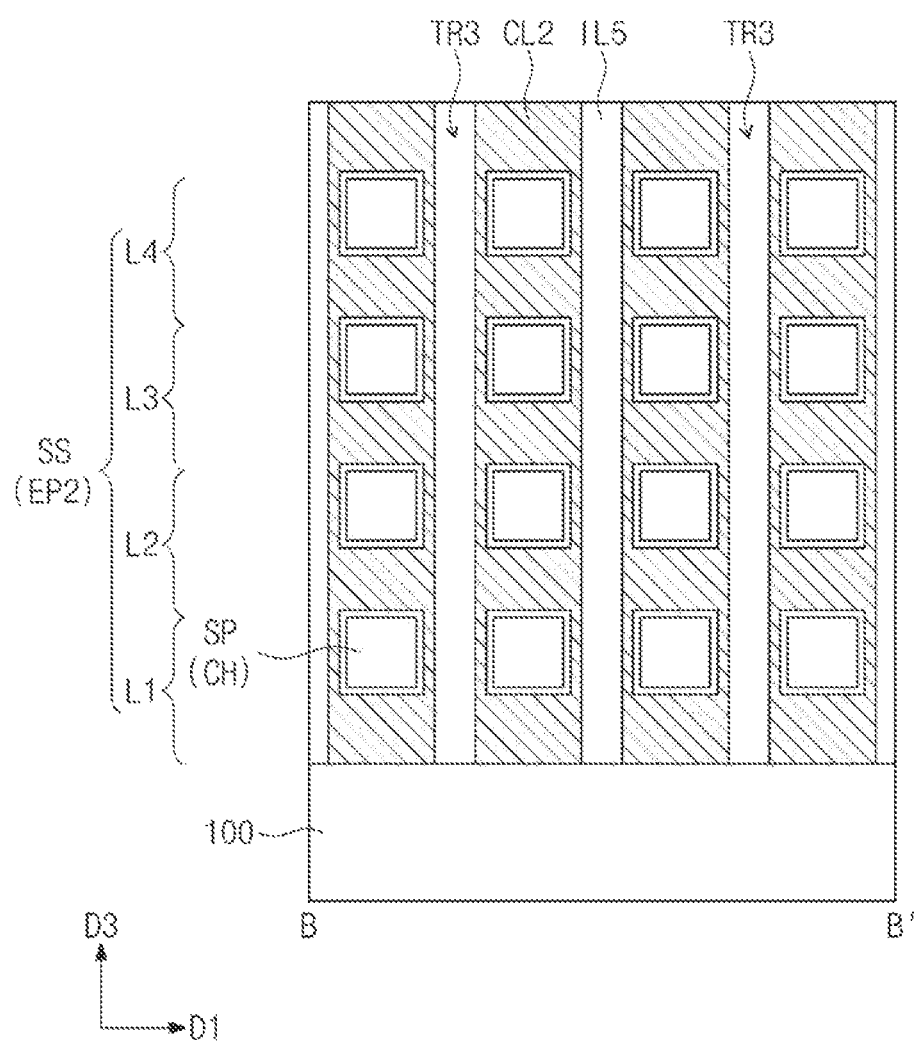
Figure 11C:
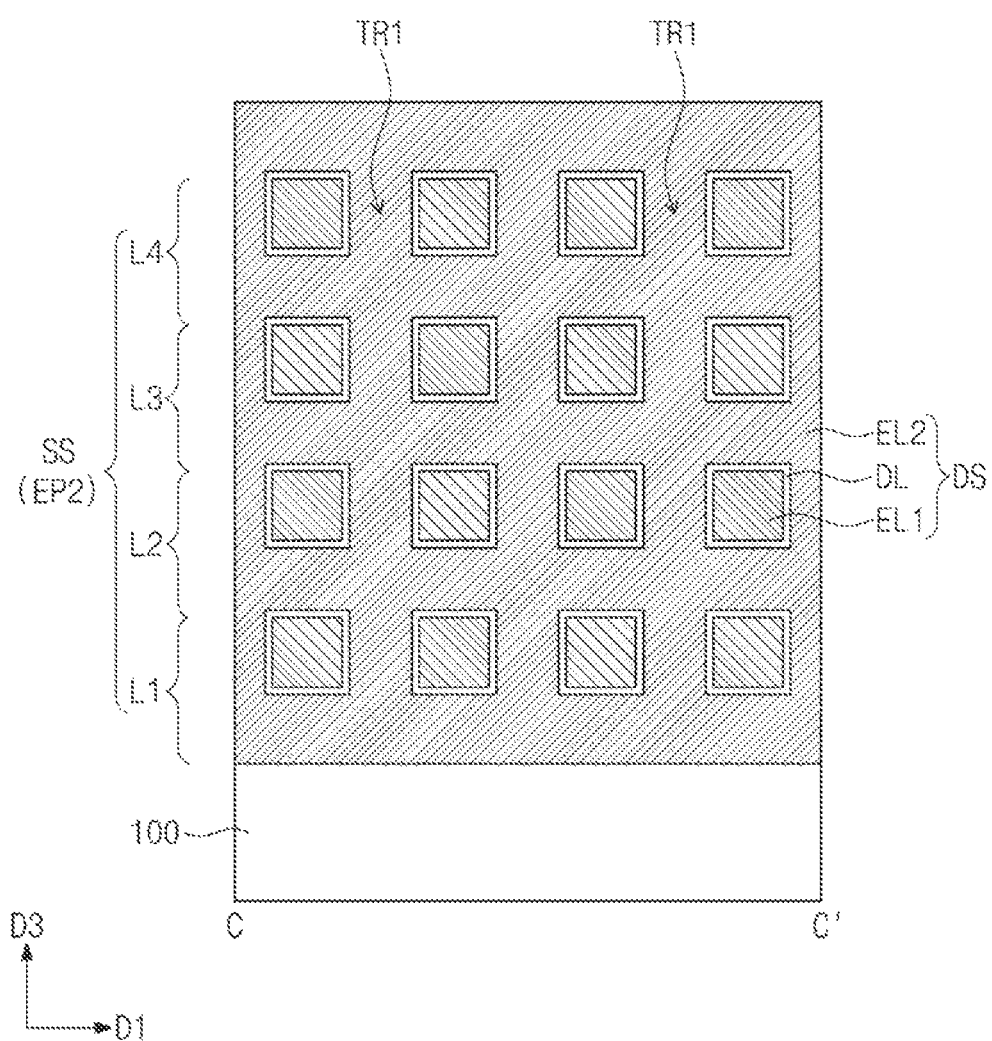
Figure 12:
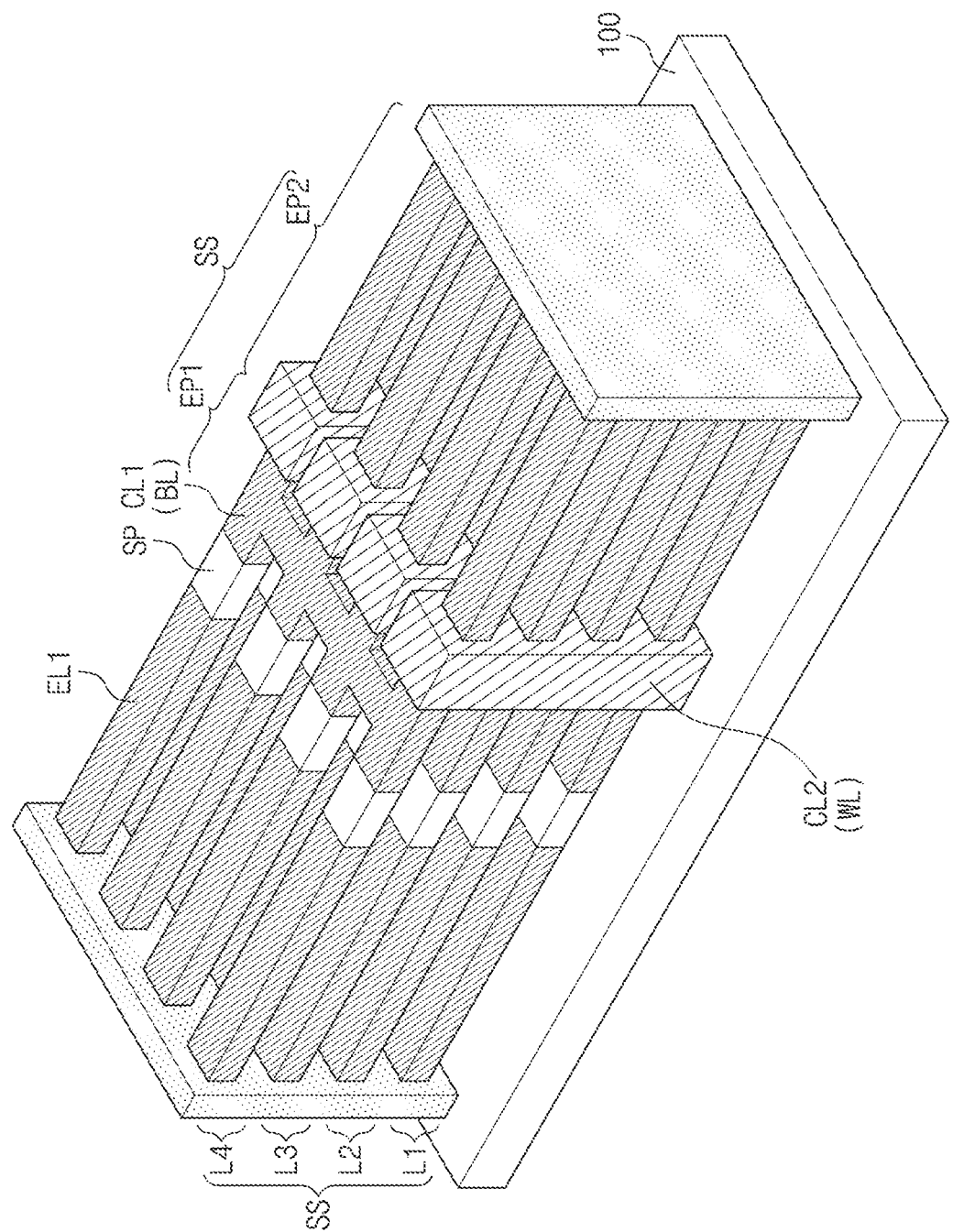
FIG. 12 is a perspective view illustrating a three-dimensional semiconductor memory device according to some embodiments of present inventive concepts.

FIG. 10 is a plan view illustrating a three-dimensional semiconductor memory device according to some embodiments of present inventive concepts. FIGS. 11A, 11B, and 11C are sectional views taken along lines A-A', B-B', and C-C', respectively, of FIG. 10. FIG. 12 is a perspective view illustrating a three-dimensional semiconductor memory device according to some embodiments of present inventive concepts. For concise description, an element previously described with reference to FIGS. 1, 2, 3A, and 3B may be identified by the same reference number without repeating an overlapping description thereof.

Referring to FIGS. 10, 11A to 11C, and 12, the stack SS may be provided on the substrate 100. The stack SS may include first to fourth layers L1, L2, L3, and L4, which are sequentially stacked on the substrate 100. Each of the first to fourth layers L1, L2, L3, and L4 may include the first conductive line CL1, the semiconductor patterns SP, and the first electrodes EL1. Insulating layers IL4 and IL5 may be interposed between the first to fourth layers L1, L2, L3, and L4. The insulating layers IL4 and IL5 may be formed of or include at least one of, for example, silicon oxide, silicon nitride, or silicon oxynitride.

Each of the first to fourth layers L1, L2, L3, and L4 of the stack SS may include a first extended portion EP1 extending in the first direction D1 and second extended portions EP2 extending from the first extended portion EP1 in the second direction D2. The first extended portion EP1 may include the first conductive line CL1. The second extended portion EP2 may include the semiconductor pattern SP and the first electrode EL1.

The first conductive line CL1 in each of the first to fourth layers L1, L2, L3, and L4 may extend in the first direction D1. The first conductive lines CL1 may be used as the bit lines BL described with reference to FIG. 1. The semiconductor patterns SP in each of the first to fourth layers L1, L2, L3, and L4 may be formed of or include a semiconductor material (e.g., silicon, germanium, or silicon germanium).

First trenches TR1 may be formed to penetrate the stack SS. The second extended portions EP2 of the stack SS may be defined by the first trenches TR1. The first trenches TR1 may be defined between each adjacent pair of the second extended portions EP2 of the stack SS.

Each first trench TR1 may be provided to horizontally separate adjacent ones of the semiconductor patterns SP from each other. The first trench TR1 may also be provided to horizontally separate adjacent ones of the first electrodes EL1 from each other. Moreover, FIGS. 11A and 11B illustrate third trenches TR3 that include the second conductive lines CL2 and the insulating layers IL5 formed therein.

Each of the semiconductor patterns SP may include the channel region CH, the first impurity region SD1, and the second impurity region SD2. The channel region CH may be interposed between the first and second impurity regions SD1 and SD2. The first conductive line CL1 may be connected to the first impurity regions SD1 of the semiconductor patterns SP. The first electrode EL1 may be connected to the second impurity region SD2 of the semiconductor pattern SP. The first electrode EL1 may extend from the second impurity region SD2 of the semiconductor pattern SP in the second direction D2.

The second conductive lines CL2 may be provided to penetrate the stack SS and to extend in the vertical direction (i.e., in the third direction D3). Each of the second conductive lines CL2 may extend in the third direction D3 to define a perimeter around (e.g., to surround a periphery of) vertically-stacked ones of the semiconductor patterns SP. The second conductive lines CL2 may be spaced apart from each other in the first direction D1. The gate insulating layer GI may be provided between the second conductive lines CL2 and the semiconductor patterns SP.

The second electrode EL2 may be provided on the first electrodes EL1. The second electrode EL2 may be provided to define a perimeter around (e.g., to surround a periphery of) the first electrodes EL1. The dielectric layer DL may be interposed between the first electrodes EL1 and the second electrode EL2. Each of the first electrodes EL1, the dielectric layer DL, and the second electrode EL2 may constitute the capacitor DS.

Supporting layers SUP may be provided (e.g., as insulating layers IL3) at both sides of the stack SS. The supporting layer SUP may be connected in common to end portions of the second extended portions EP2 of the stack SS. The supporting layer SUP may be used to structurally support the first electrodes EL1 of the stack SS.

FIGS. 13, 15, 17, 19, 21, 23, 25, 27, 29 and 31 are plan views illustrating a method of fabricating a three-dimensional semiconductor memory device, according to some embodiments of present inventive concepts. FIGS. 14, 16A, 18A, 20A, 22A, 24A, 26A, 28A, 30A, and 32A are sectional views that are respectively taken along lines A-A' of FIGS. 13, 15, 17, 19, 21, 23, 25, 27, 29, and 31. FIGS. 16B, 18B, 20B, 22B, 24B, 26B, 28B, 30B, and 32B are sectional views that are respectively taken along lines B-B' of FIGS. 15, 17, 19, 21, 23, 25, 27, 29, and 31. FIGS. 20C, 22C, 24C, 26C, 28C, 30C, and 32C are sectional views that are respectively taken along lines C-C' of FIGS. 19, 21, 23, 25, 27, 29, and 31.

Figure 13:
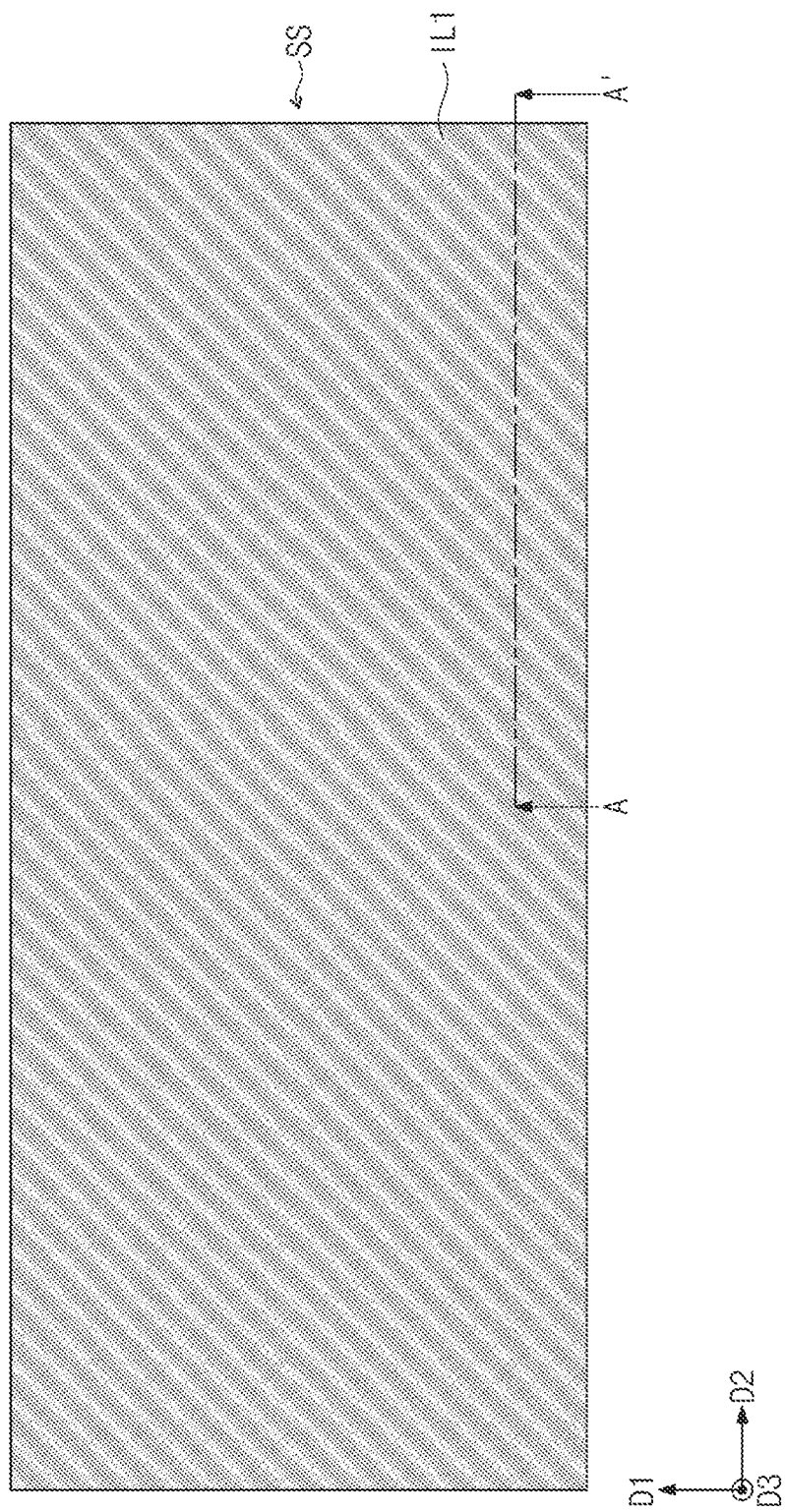
Figure 14:
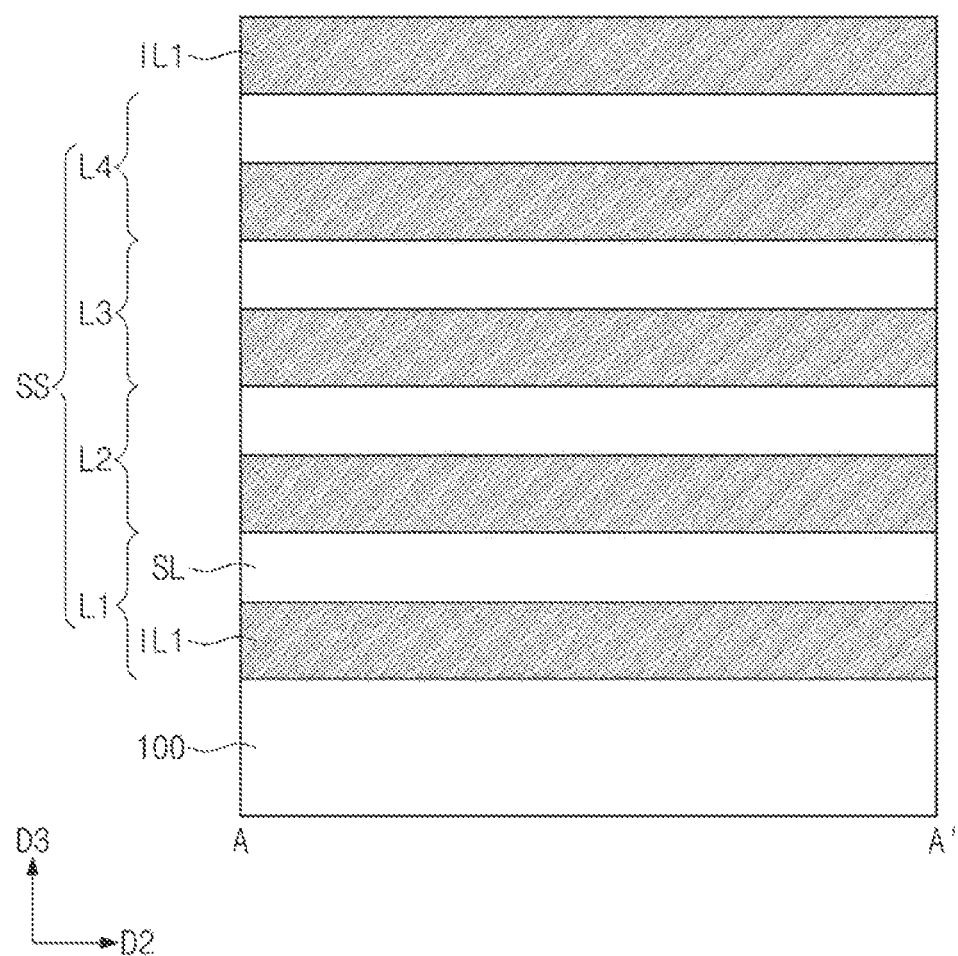
FIGS. 14, 16A, 18A, 20A, 22A, 24A, 26A, 28A, 30A, and 32A are sectional views that are respectively taken along lines A-A' of FIGS. 13, 15, 17, 19, 21, 23, 25, 27, 29, and 31.

Referring to FIGS. 13 and 14, the stack SS may be formed on the substrate 100. The formation of the stack SS may include sequentially forming the first to fourth layers L1, L2, L3, and L4 on the substrate 100. Each of the first to fourth layers L1, L2, L3, and L4 may include a first insulating layer IL1 and a semiconductor layer SL. The semiconductor layer SL may be formed of or include a semiconductor material (e.g., silicon, germanium, or silicon germanium). The first insulating layer IL1 may be formed of or include at least one of silicon oxide, silicon nitride, or silicon oxynitride. For example, the first insulating layer IL1 may include a silicon oxide layer.

An additional first insulating layer IL1 may be formed on the stack SS. For example, the additional first insulating layer IL1 may be further formed on (e.g., to cover) the uppermost layer of the semiconductor layers SL of the stack SS.

Figure 15:
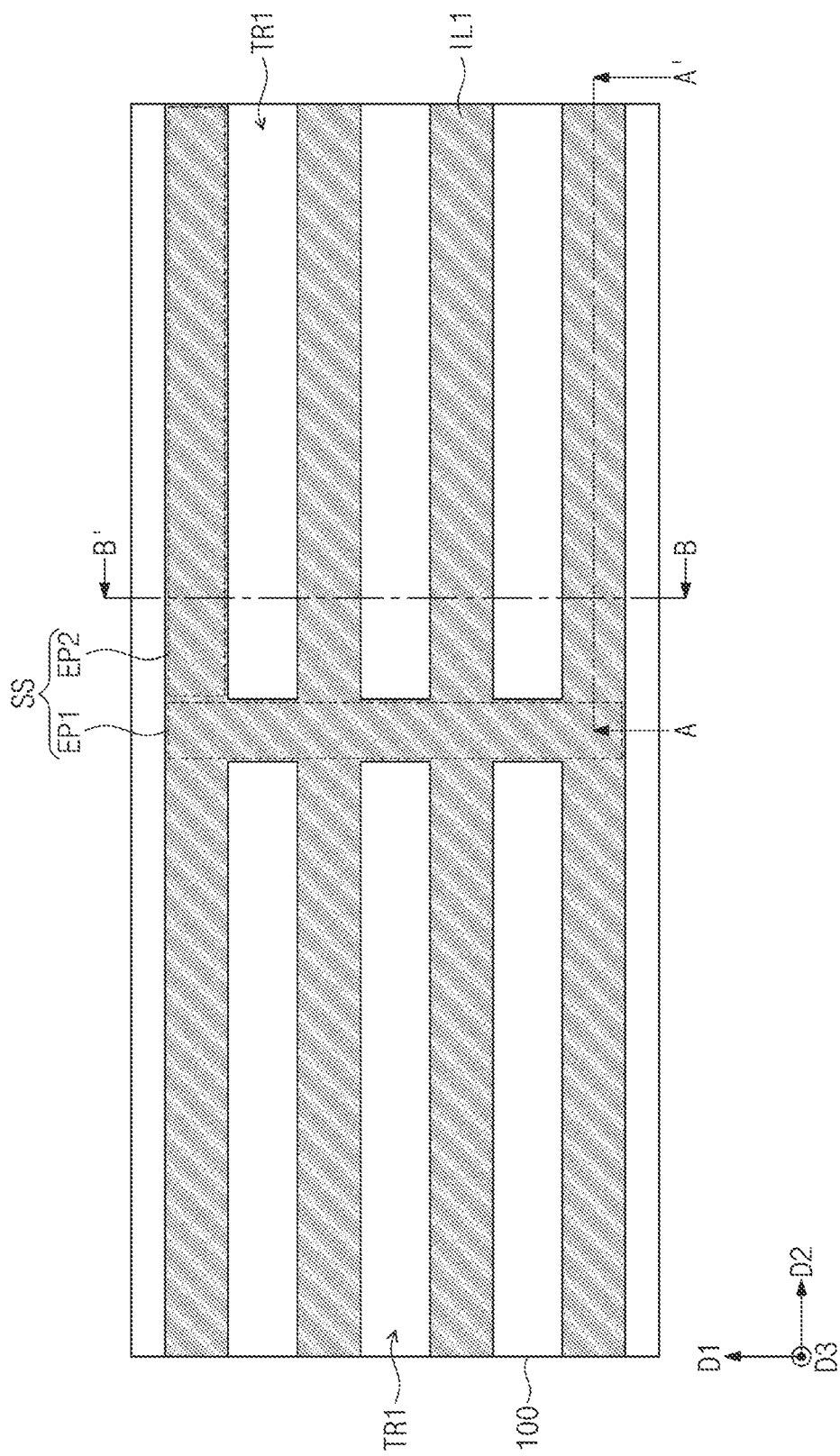
Figure 16A:
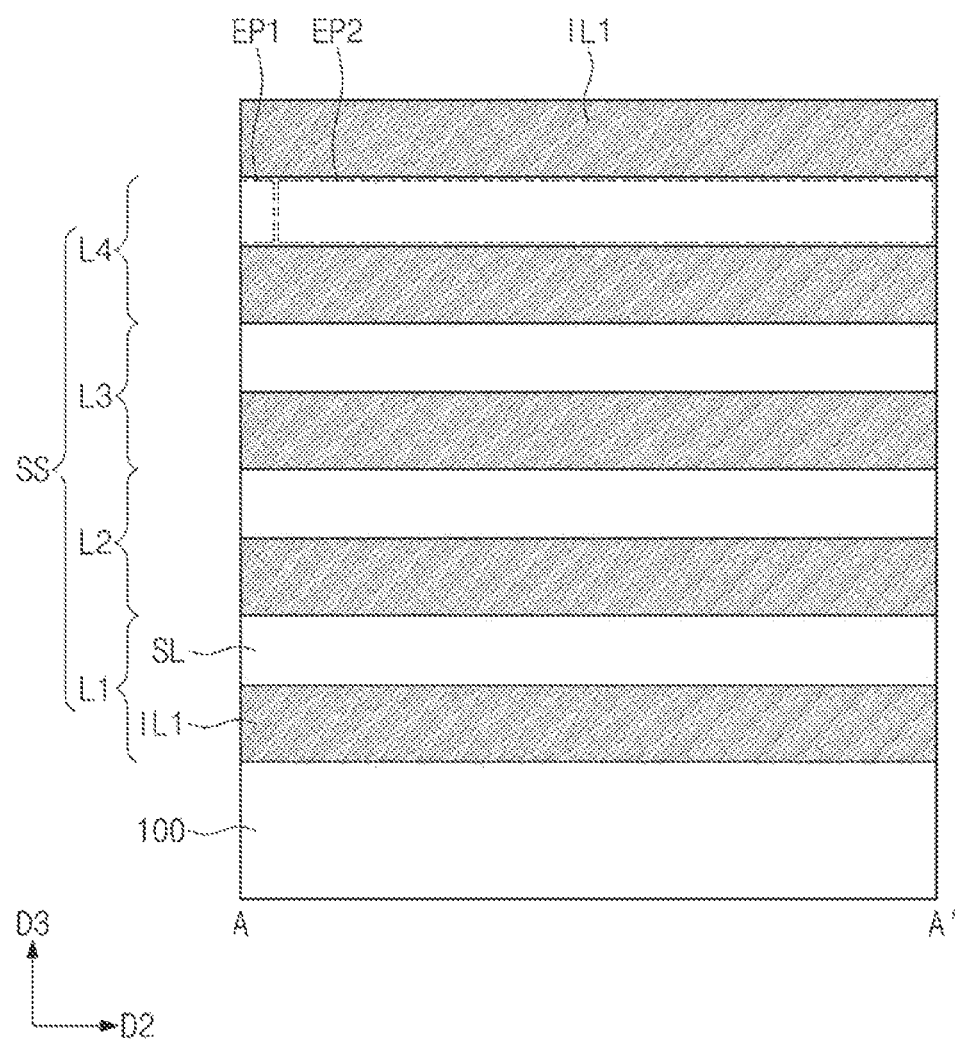
Figure 16B:
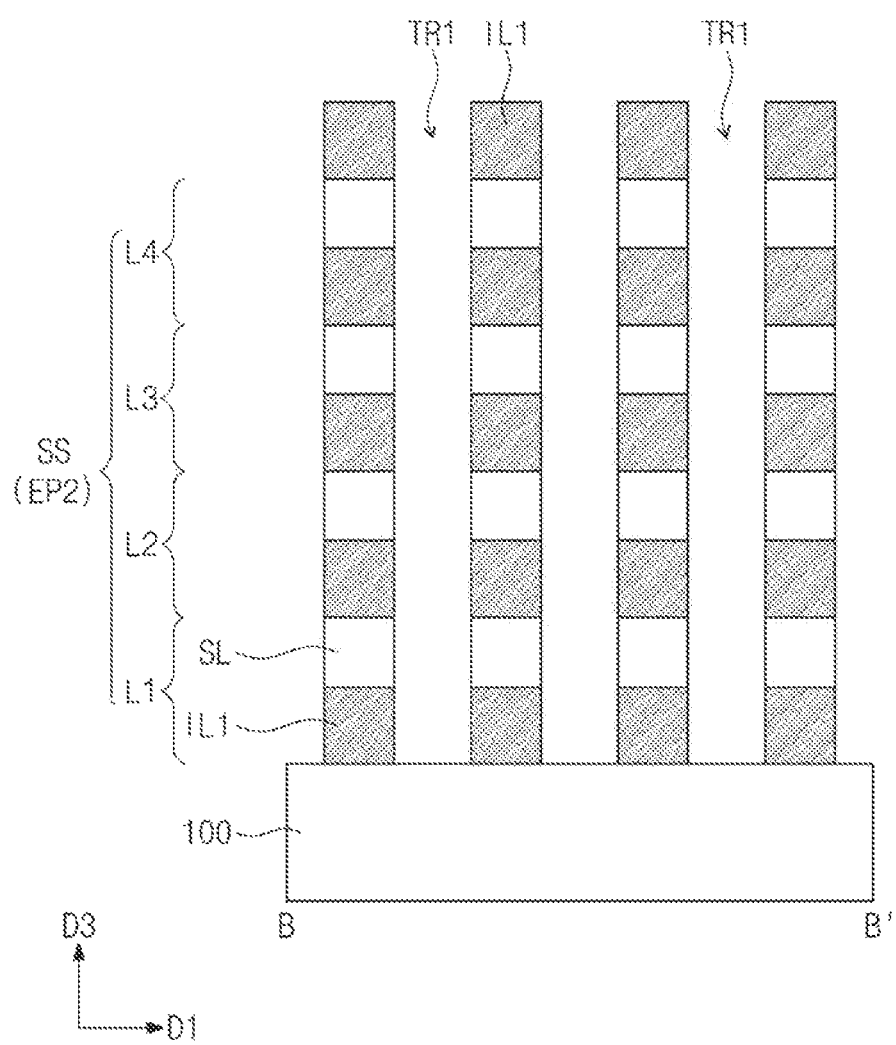
FIGS. 16B, 18B, 20B, 22B, 24B, 26B, 28B, 30B, and 32B are sectional views that are respectively taken along lines B-B' of FIGS. 15, 17, 19, 21, 23, 25, 27, 29, and 31.

Referring to FIGS. 15, 16A, and 16B, a first patterning process may be performed on the substrate 100 to form the first trenches TR1. The stack SS may be patterned to have the first extended portion EP1 and the second extended portions EP2. For example, the first patterning process may include forming a first mask pattern having first openings, etching the stack SS using the first mask pattern as an etch mask, and removing the first mask pattern. The first trenches TR1 may be formed to expose a portion of the top surface of the substrate 100.

The first extended portion EP1 of the stack SS may be formed to extend in the first direction D1. The second extended portions EP2 of the stack SS may be connected to the first extended portion EP1 and may extend in the second direction D2. The second extended portions EP2 may be spaced apart from each other in the first direction D1.

Figure 17:
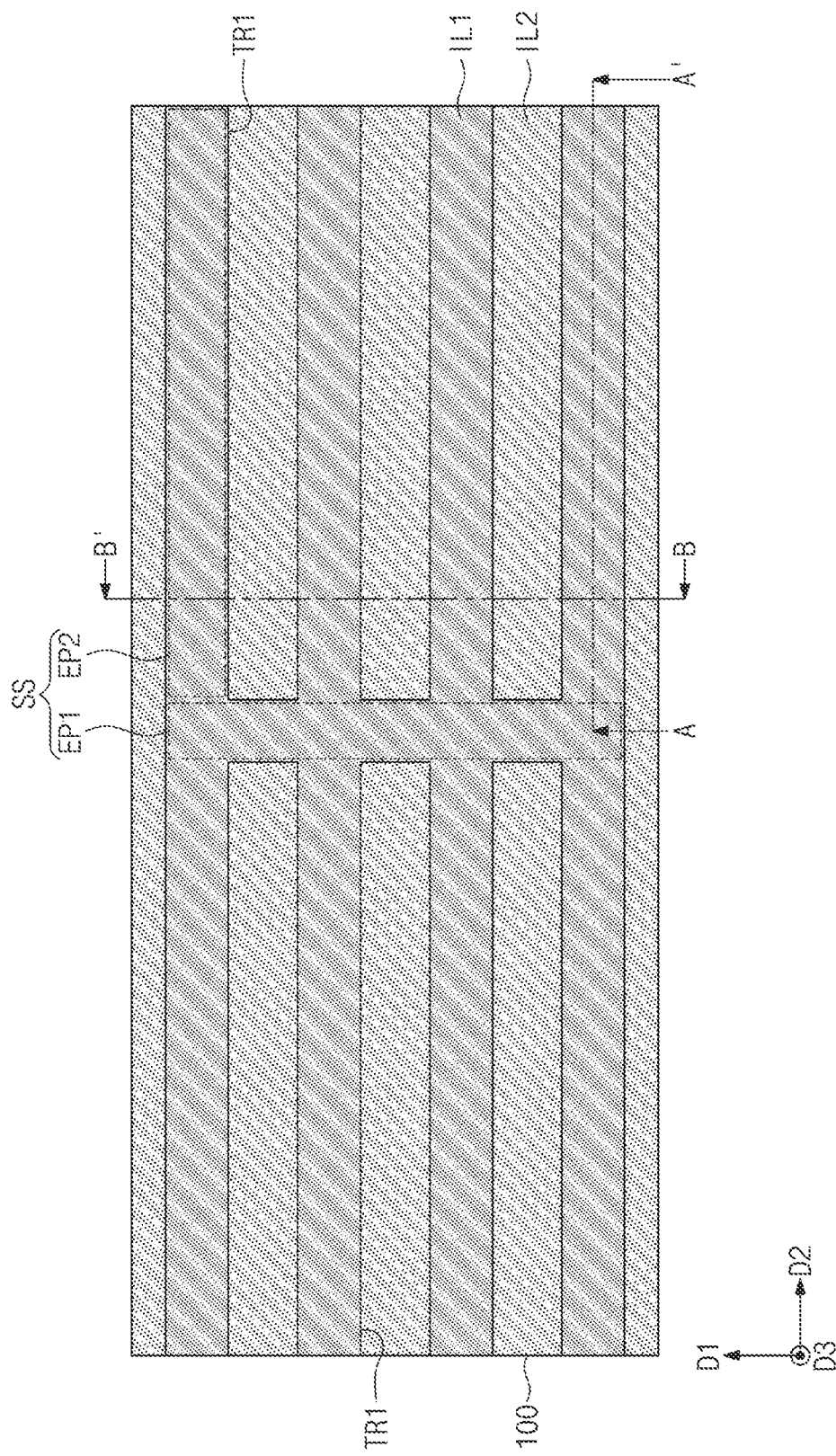
Figure 18A:
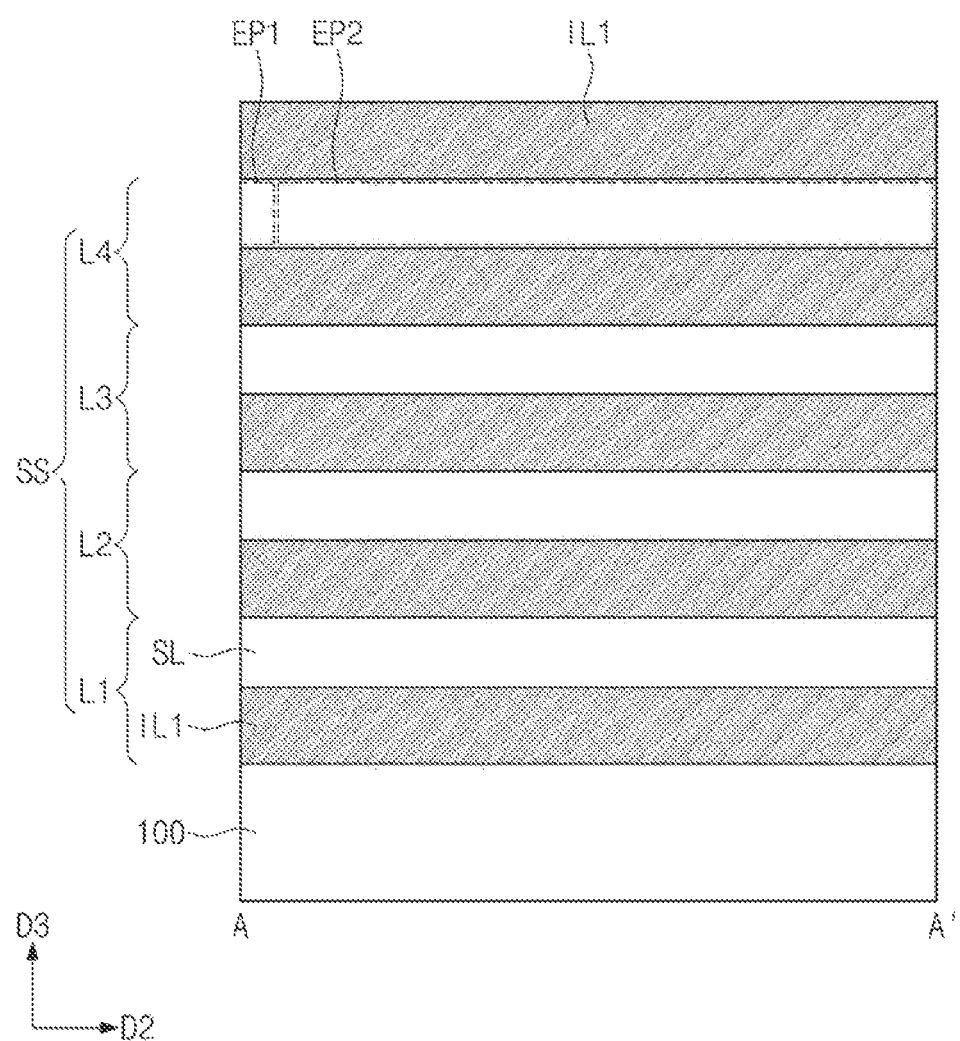
Figure 18B:
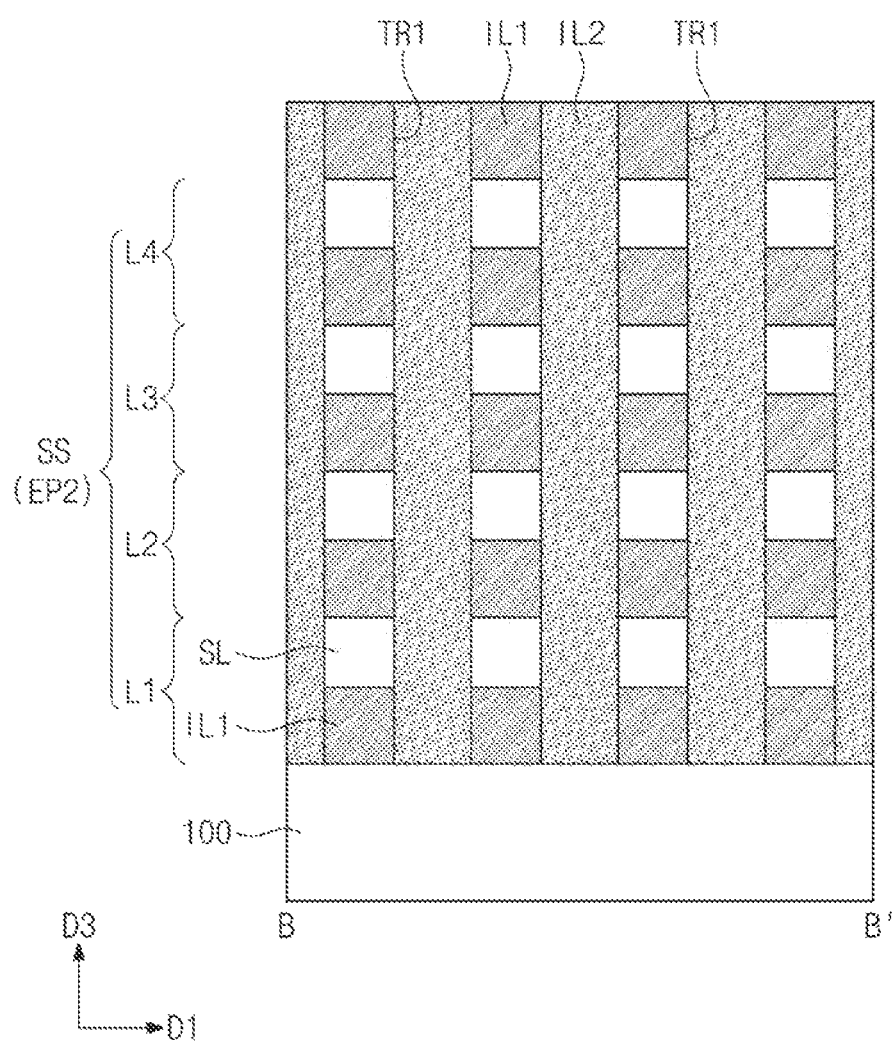
Figure 19:
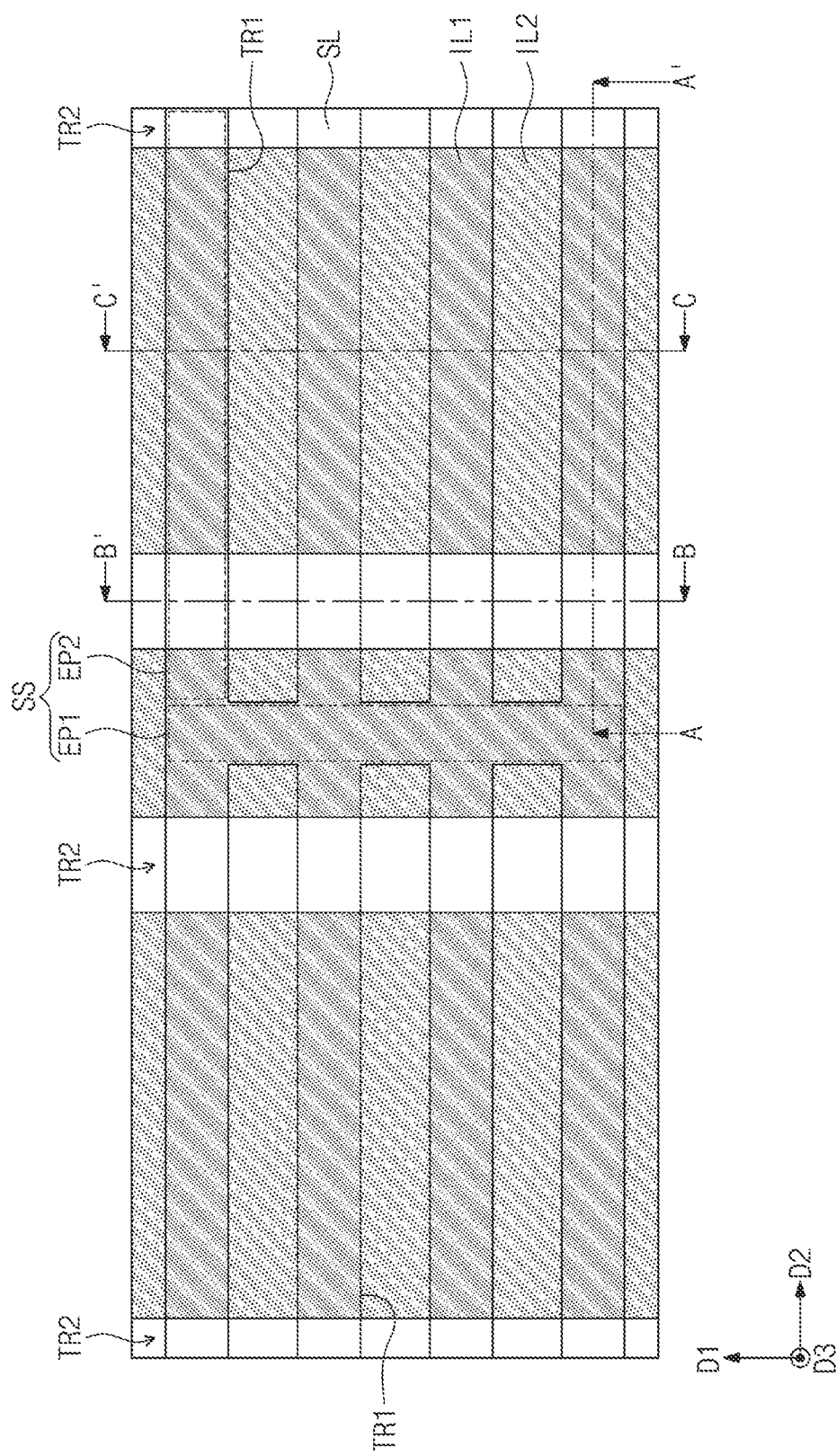
Figure 20A:
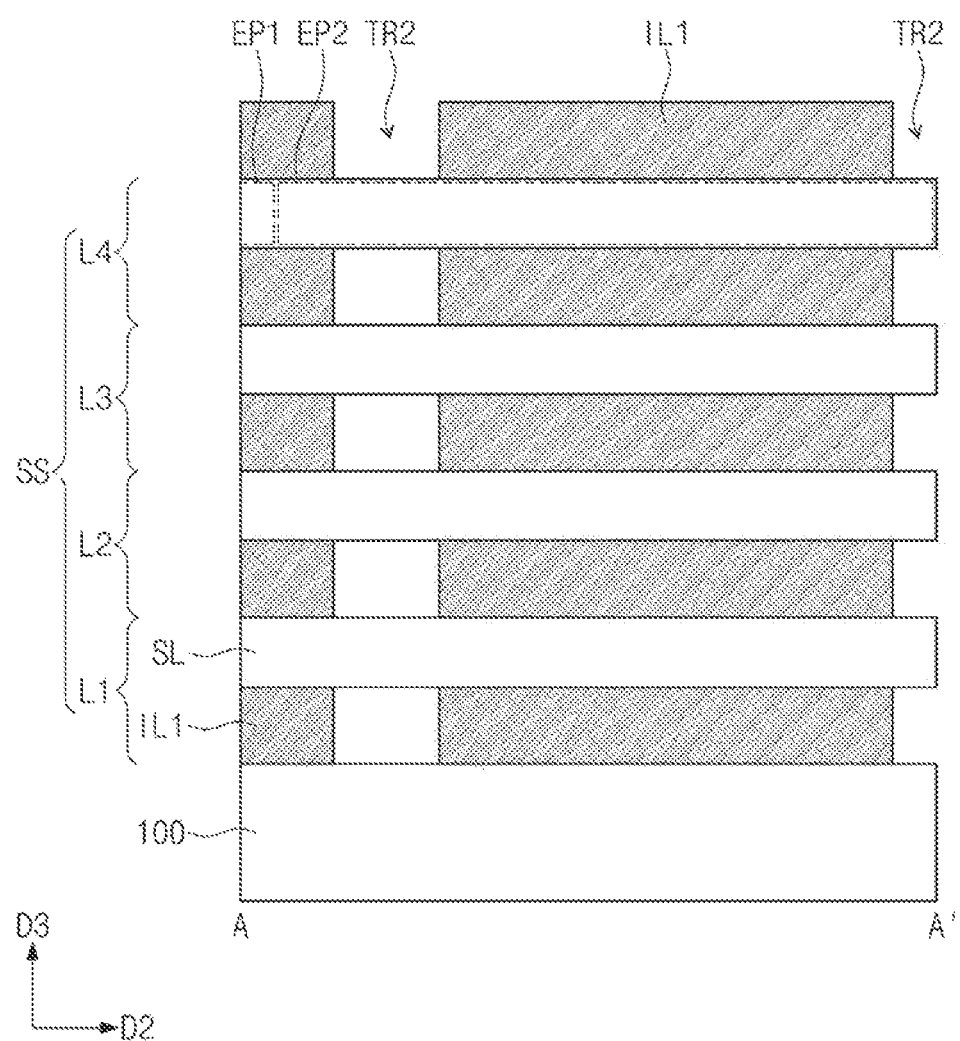
Figure 20B:
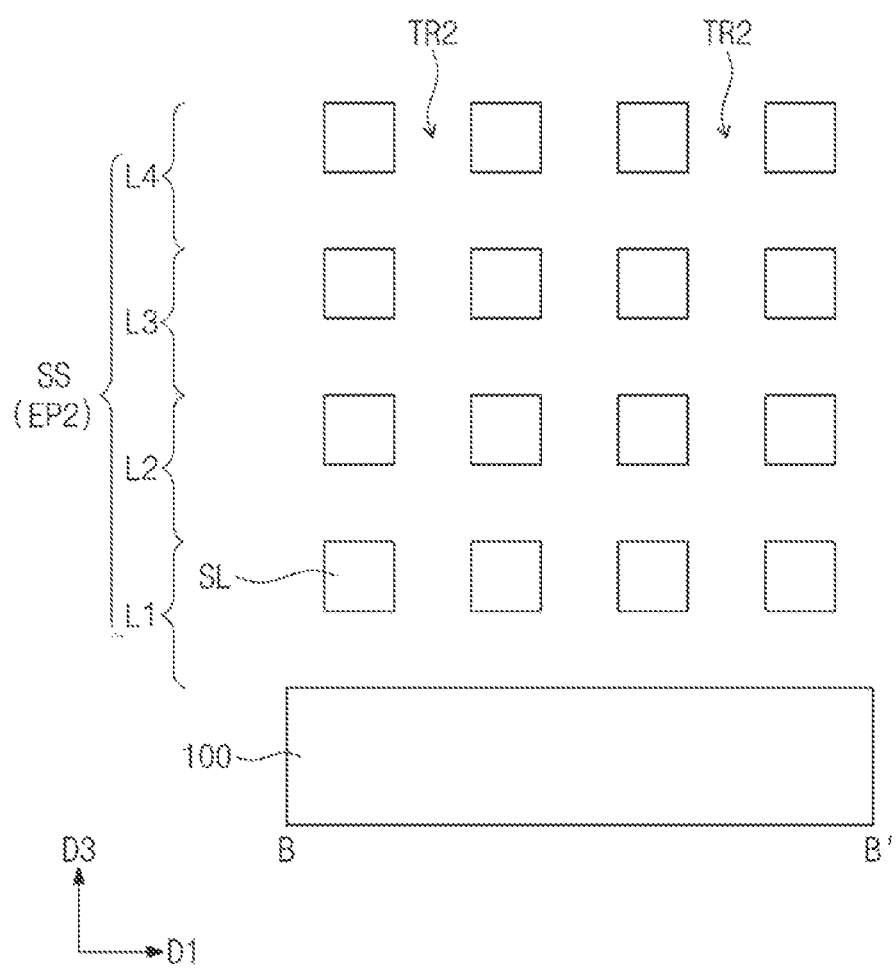
Figure 20C:
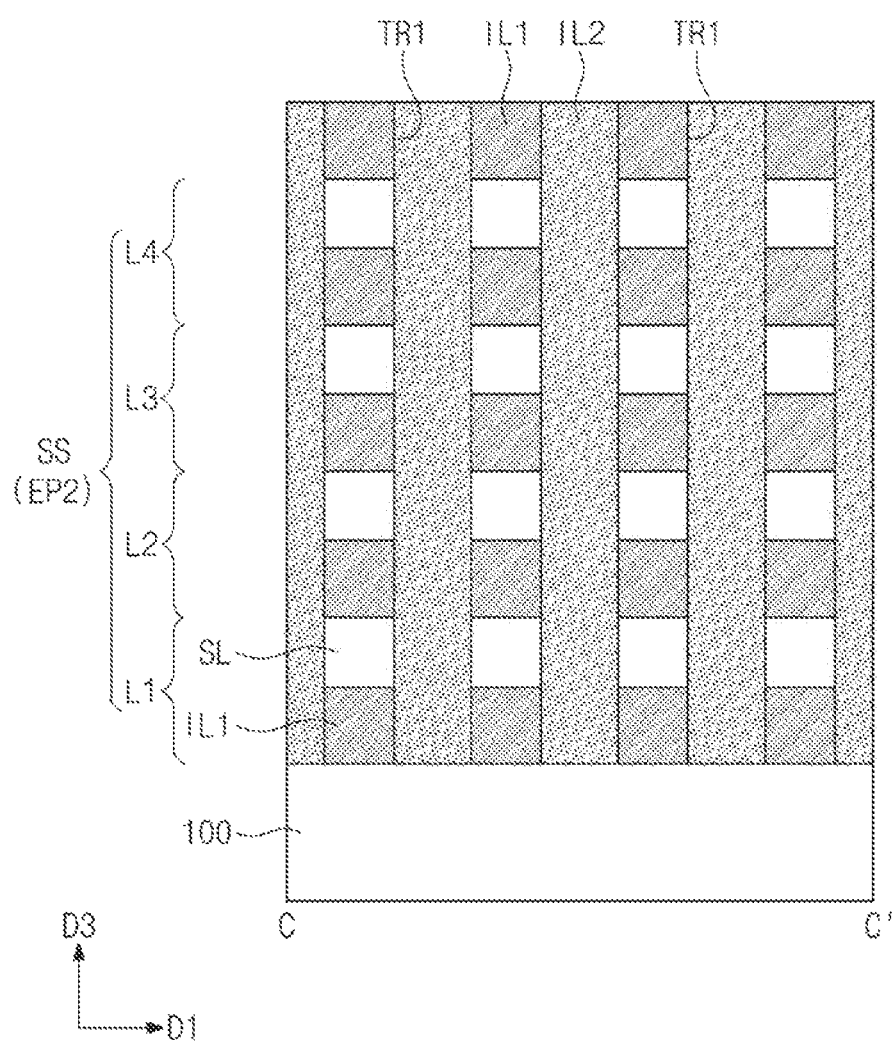
FIGS. 20C, 22C, 24C, 26C, 28C, 30C, and 32C are sectional views that are respectively taken along lines C-C' of FIGS. 19, 21, 23, 25, 27, 29, and 31.
Figure 21:
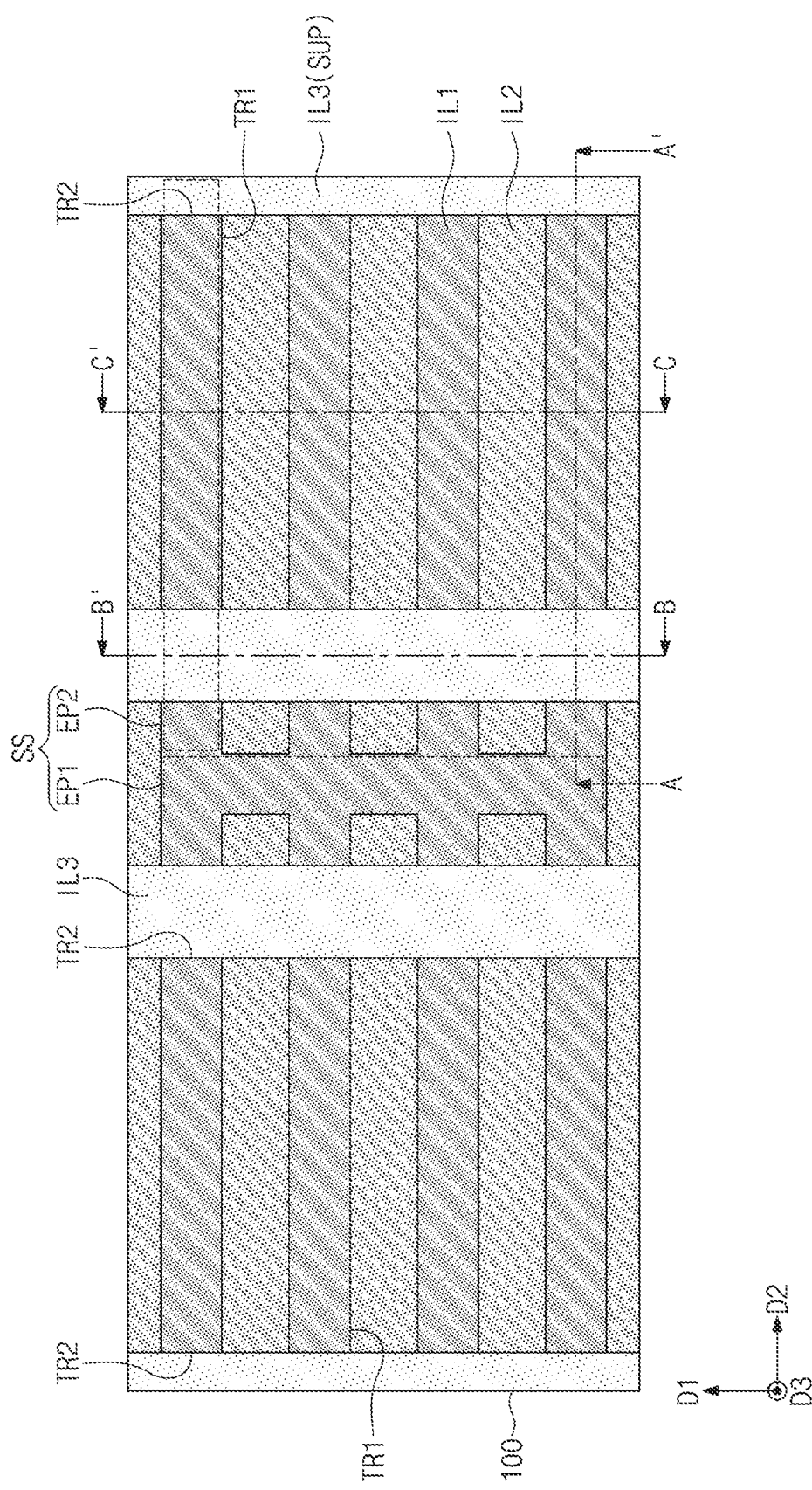
Figure 22A:
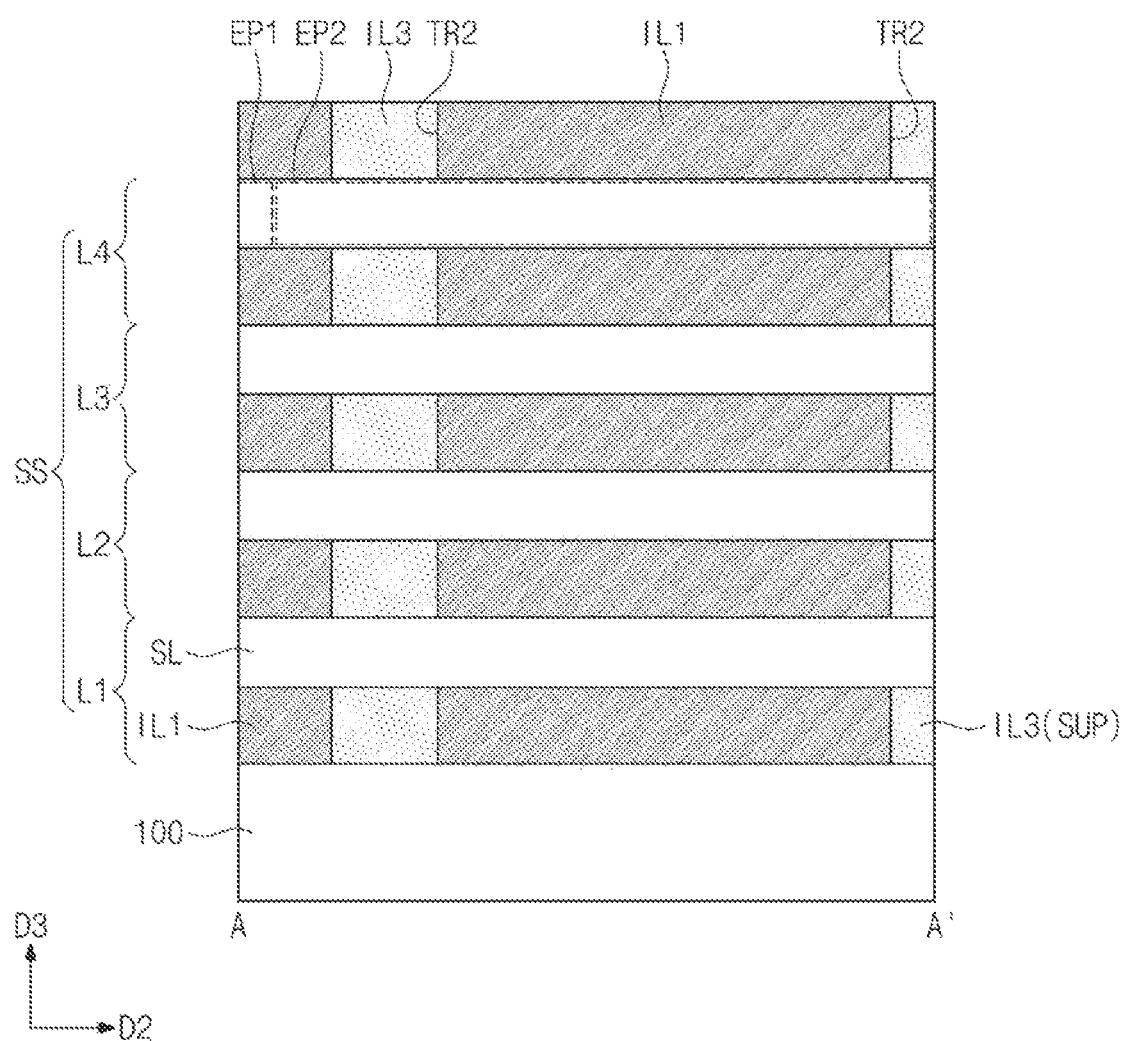
Figure 22B:
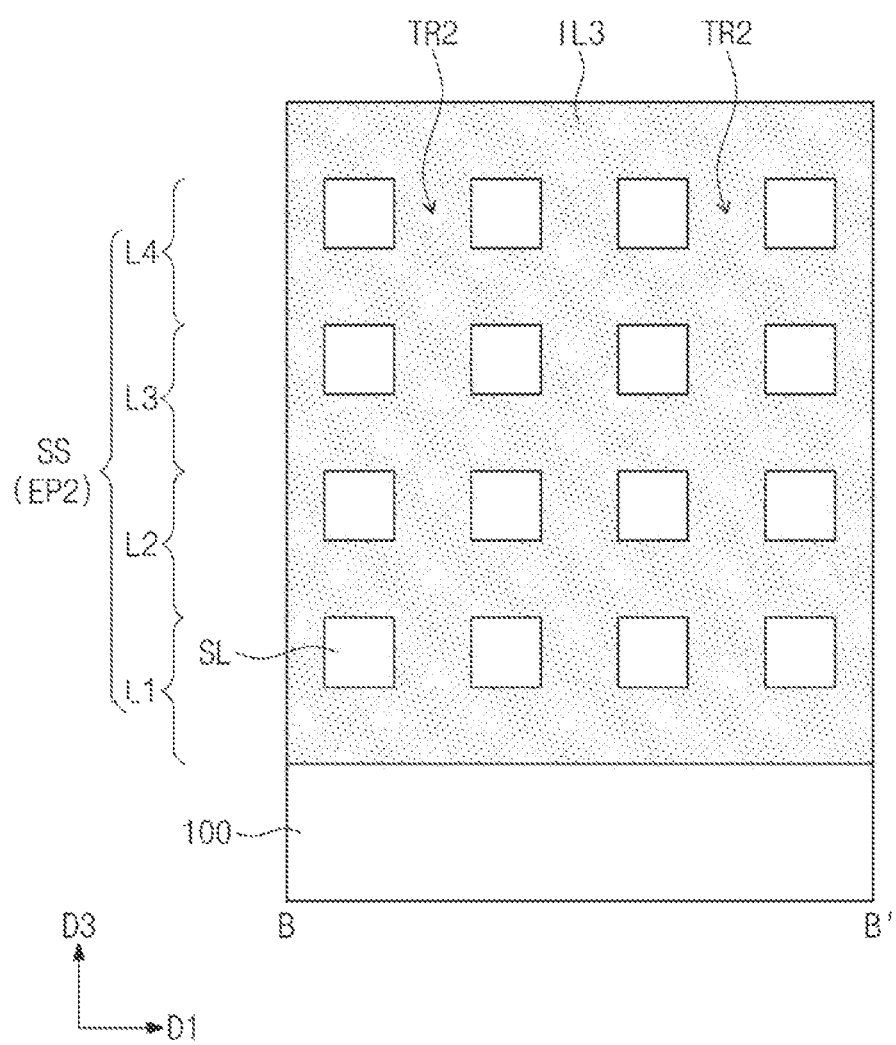
Figure 22C:
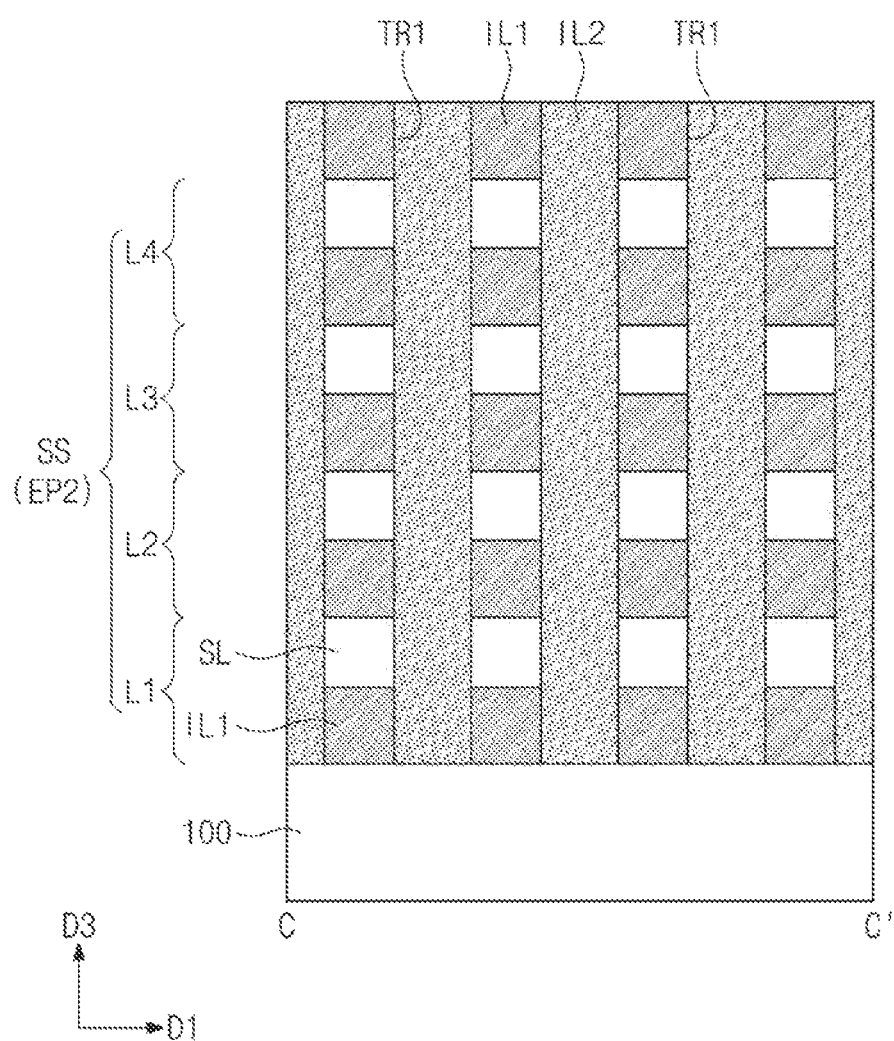
Figure 24A:
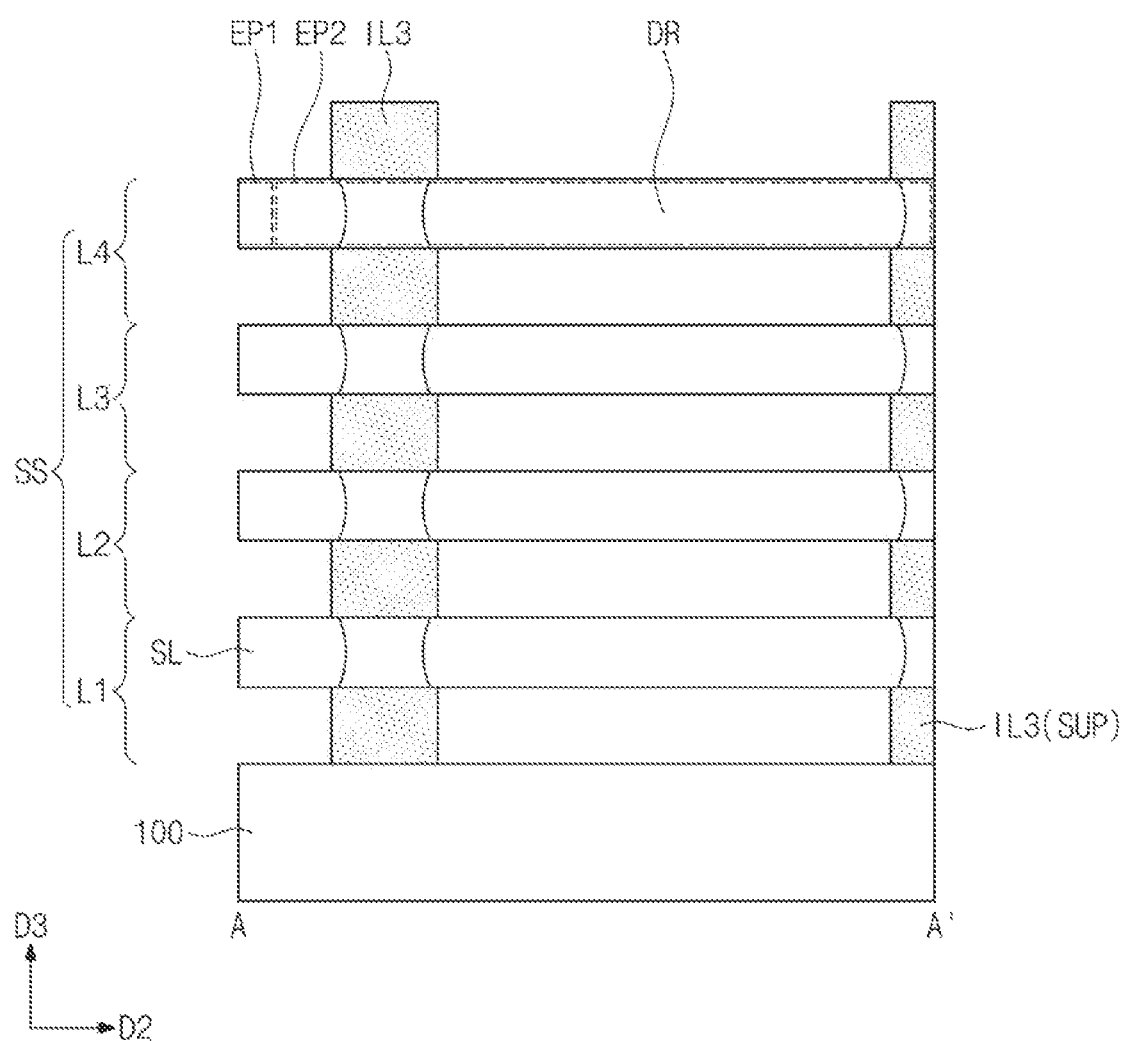
Figure 24B:
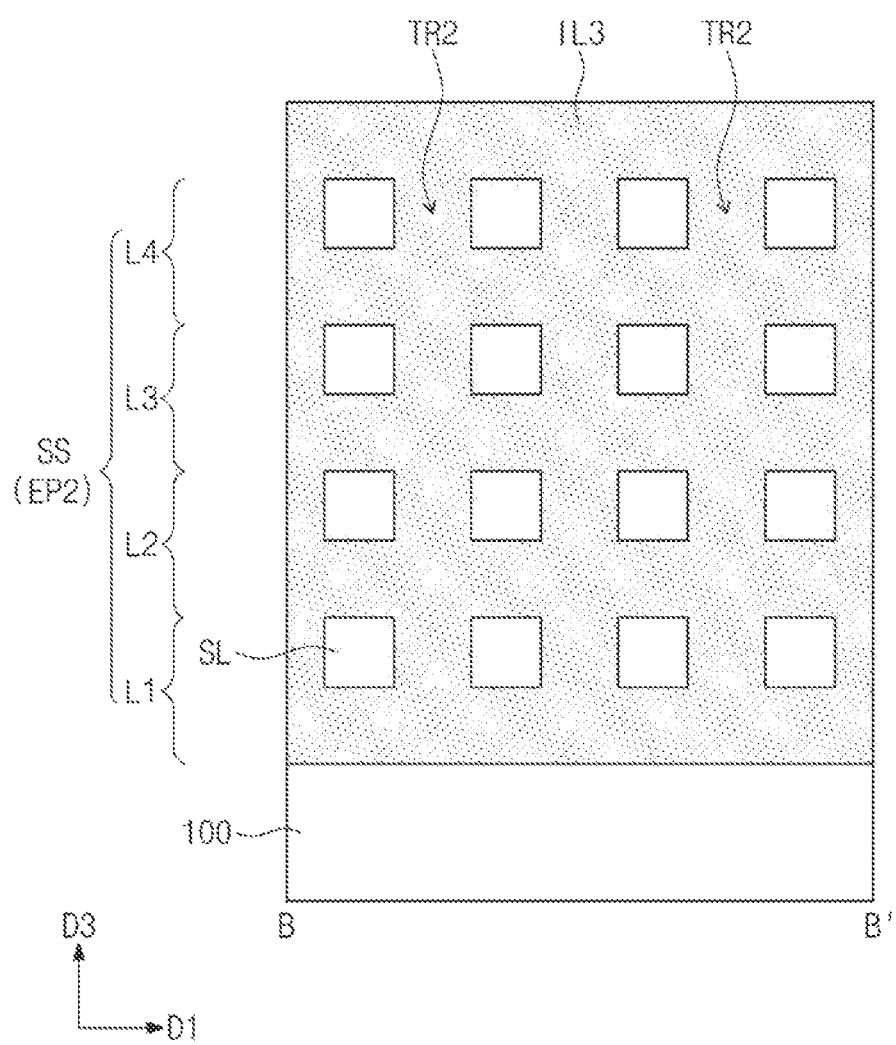
Figure 24C:
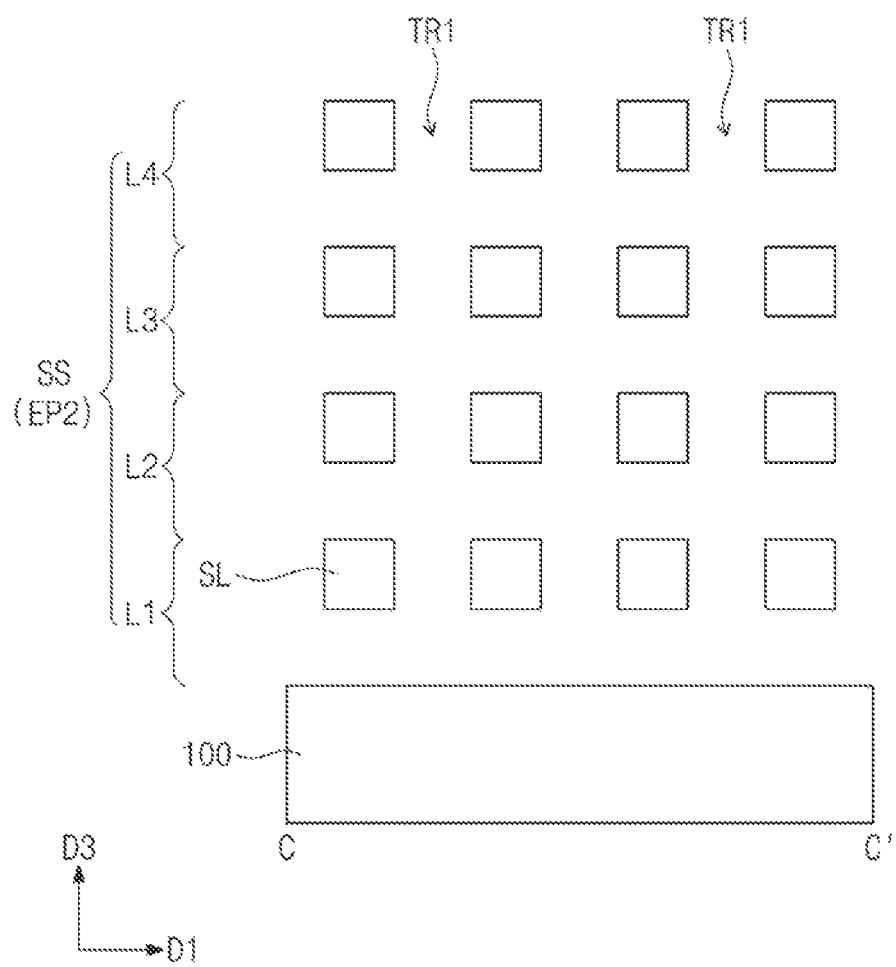
Figure 25:
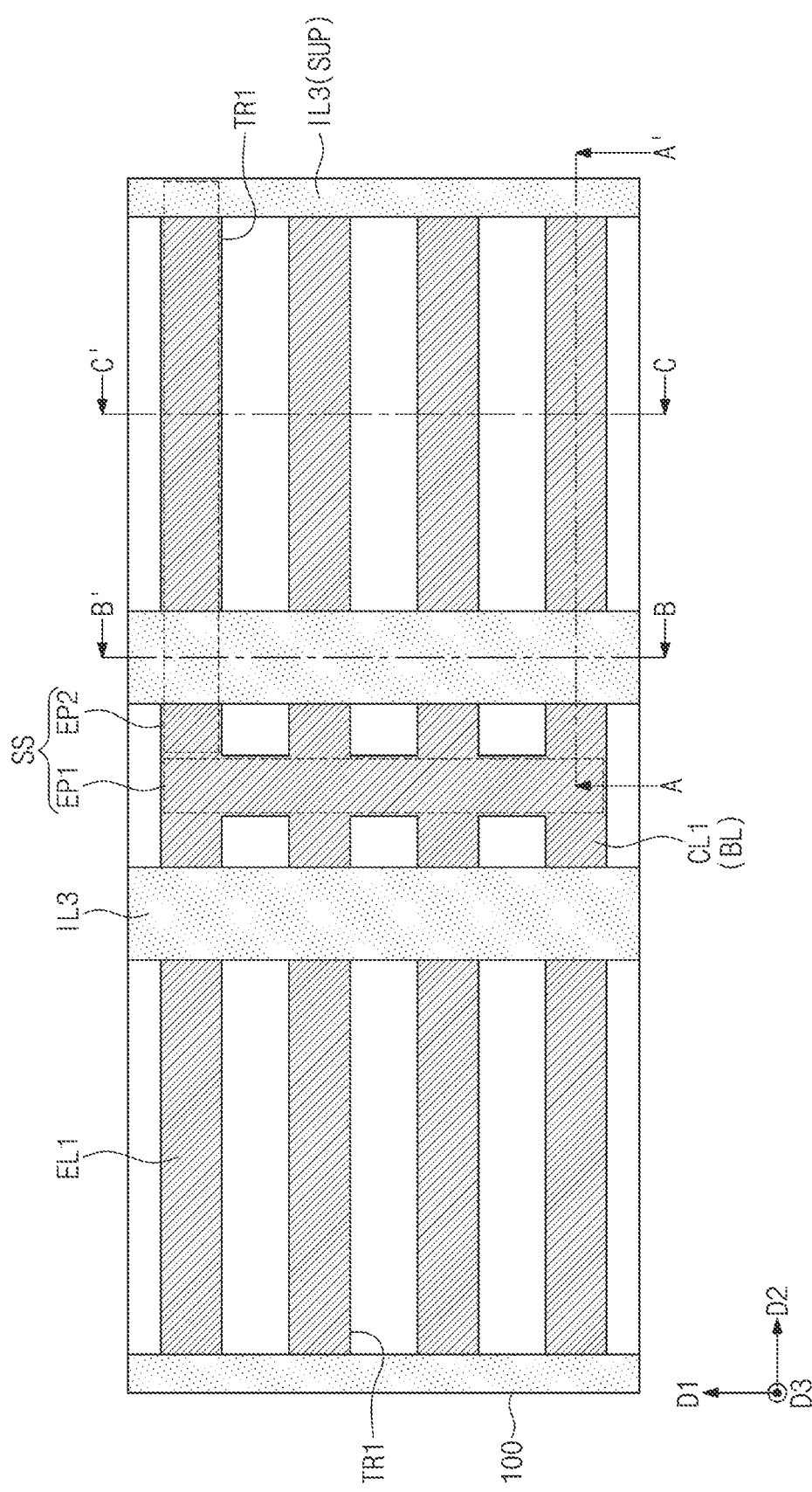
Figure 26A:
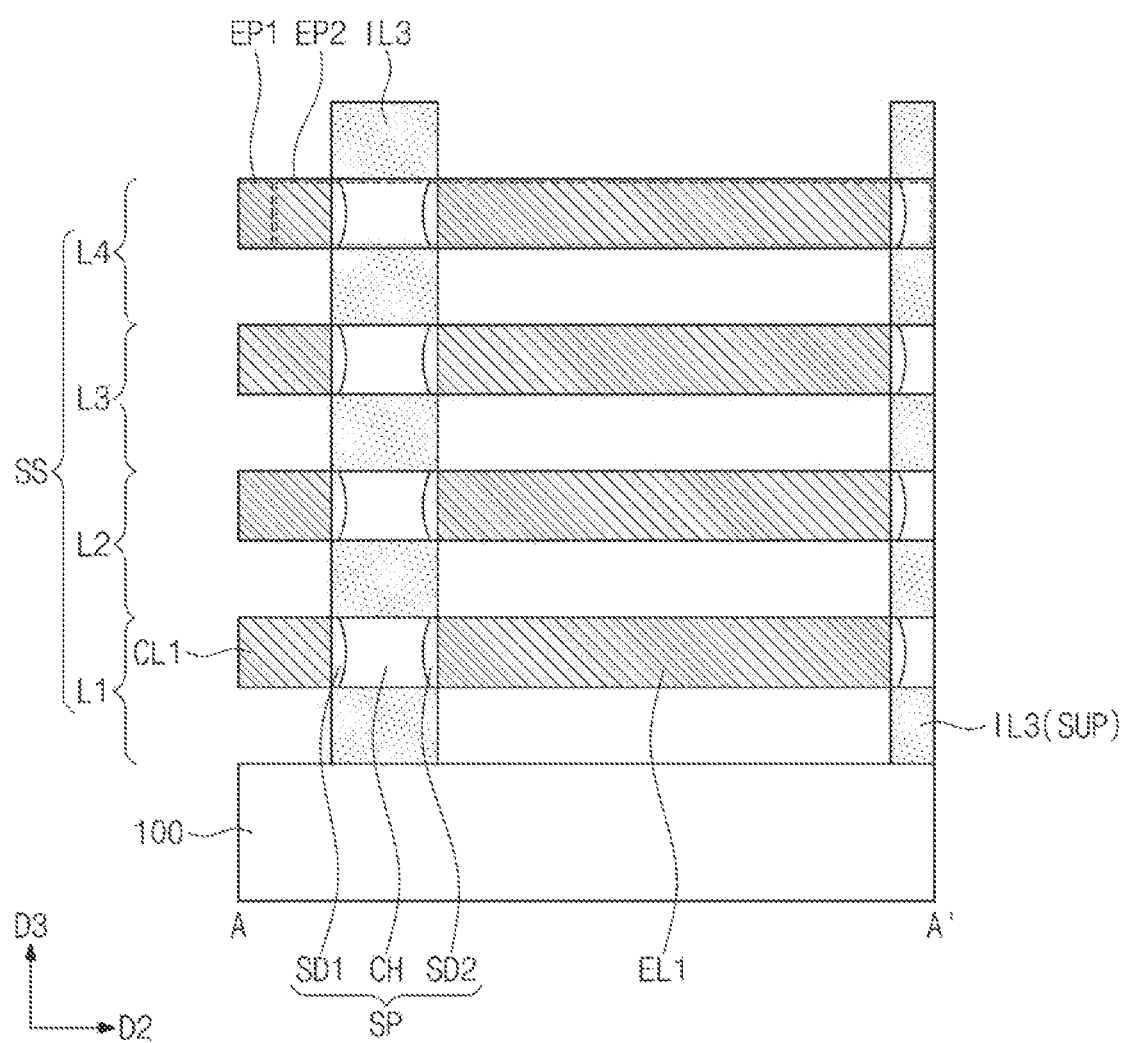
Figure 26B:
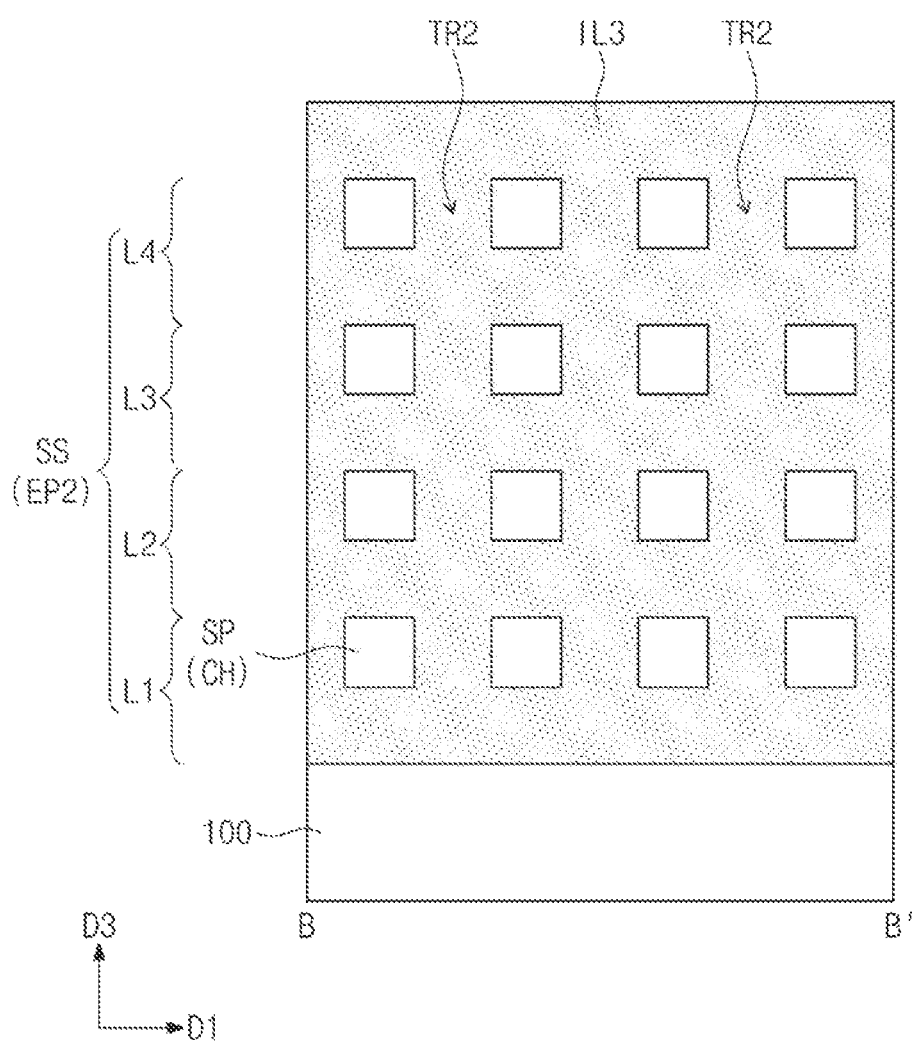
Figure 26C:
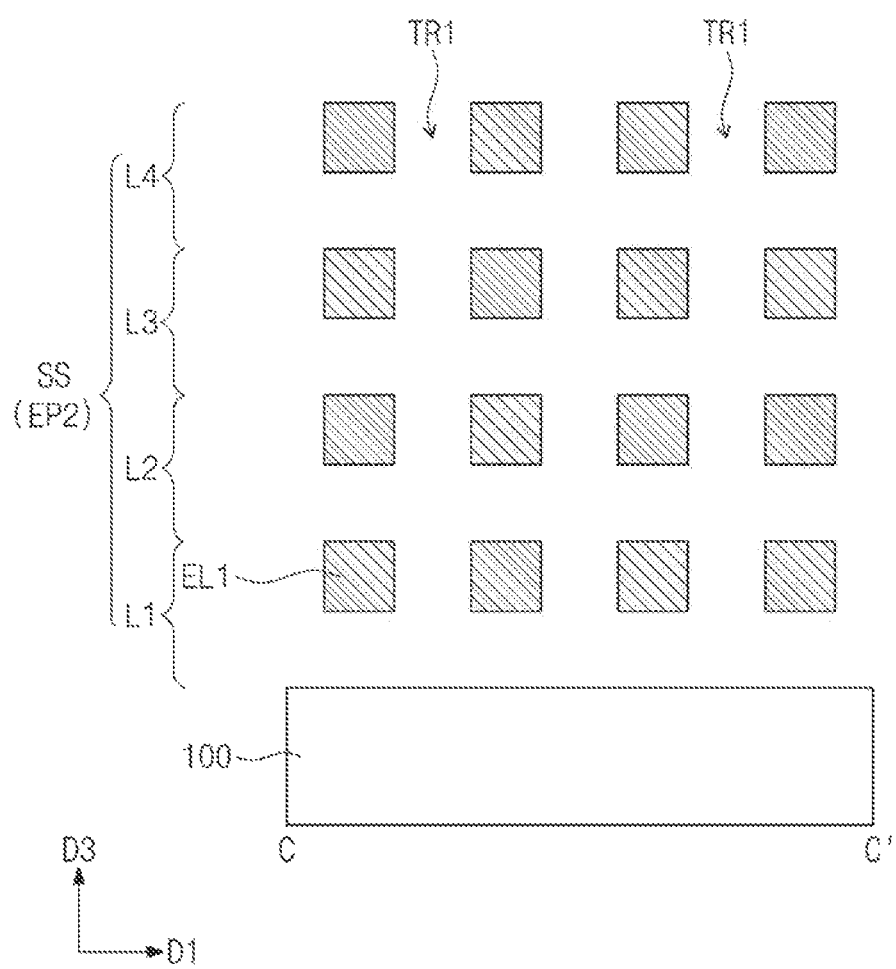
Figure 27:
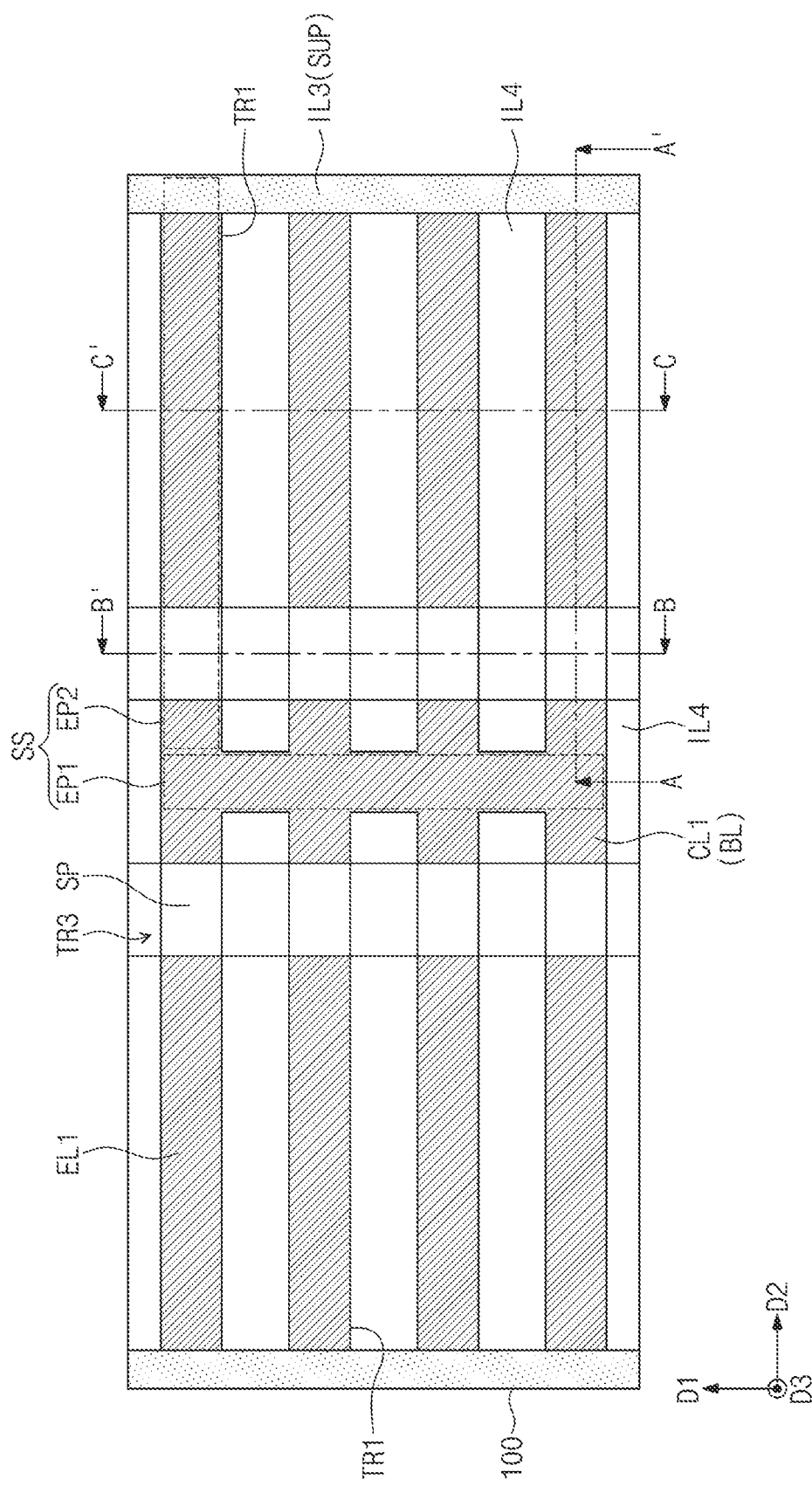
Figure 28A:
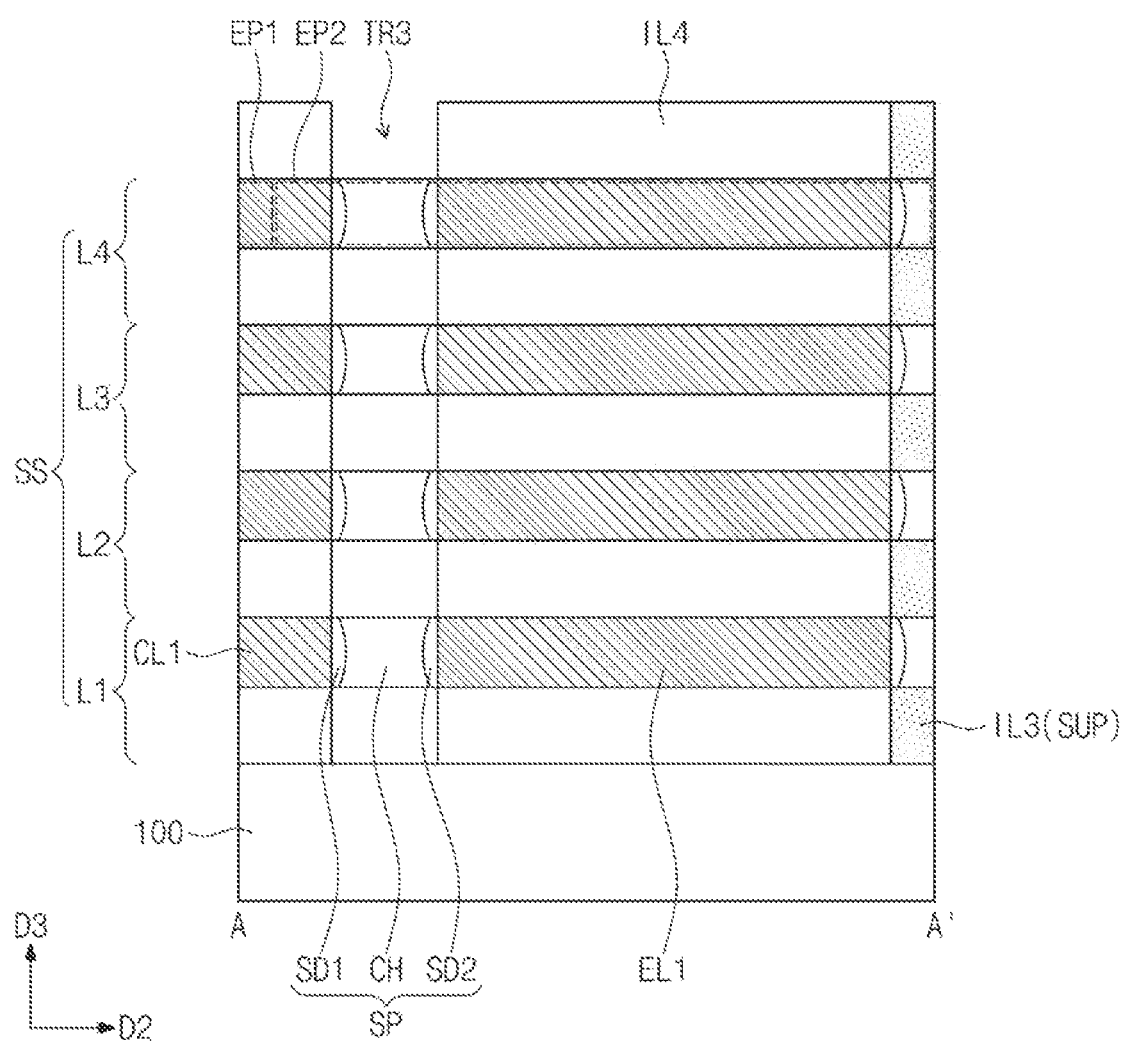
Figure 28B:
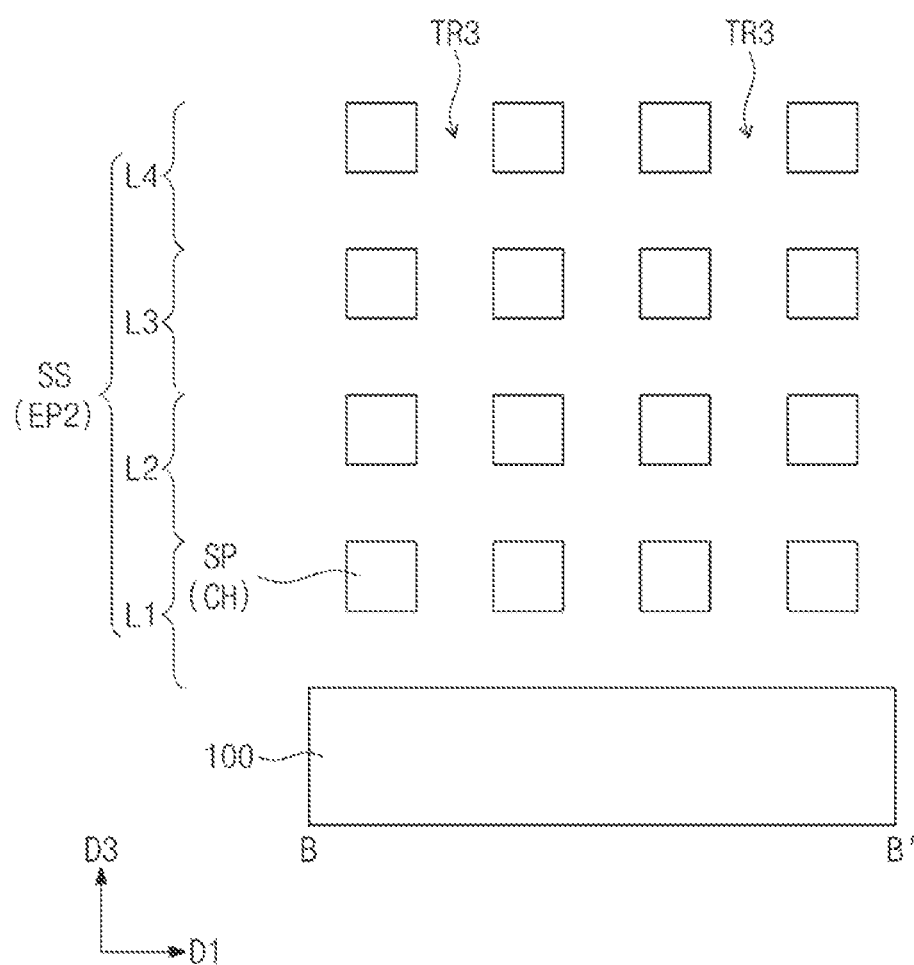
Figure 28C:
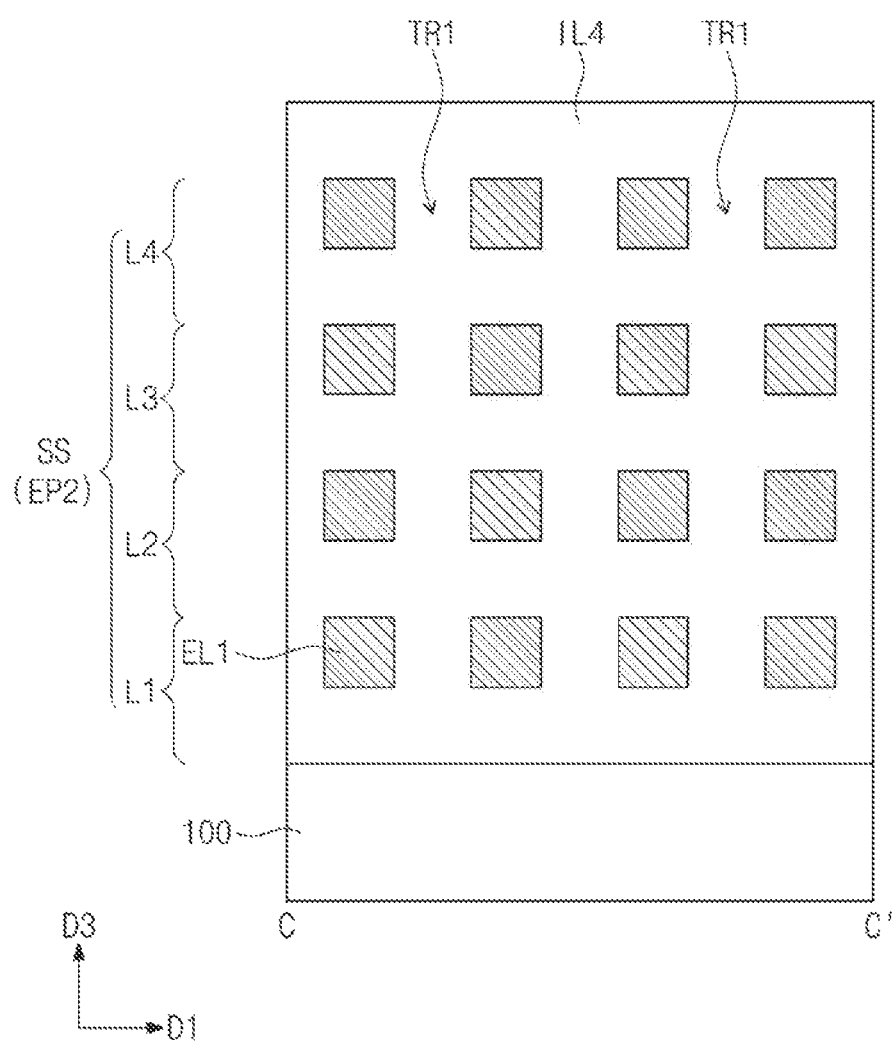
Figure 29:
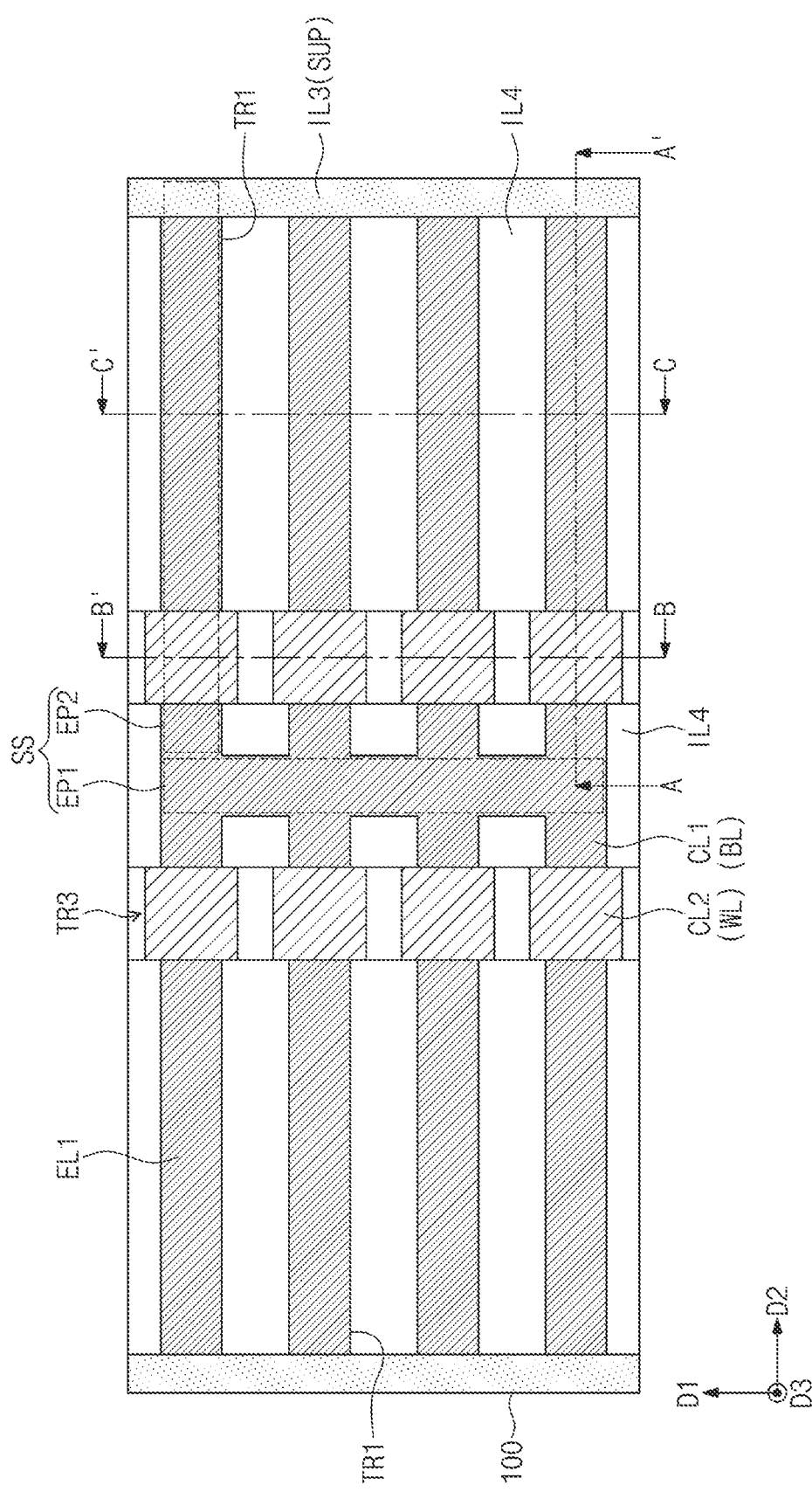
Figure 30A:
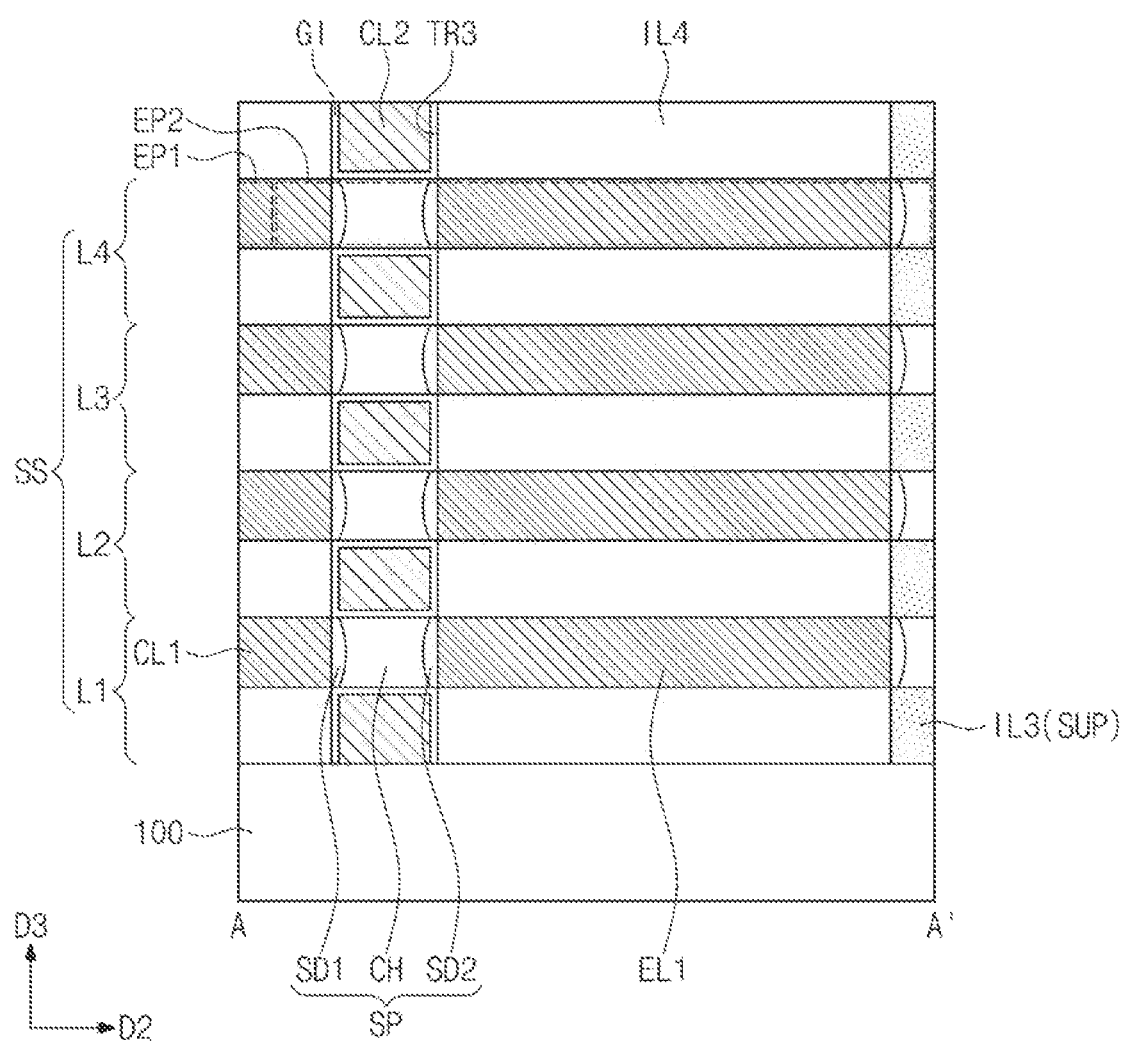
Figure 30B:
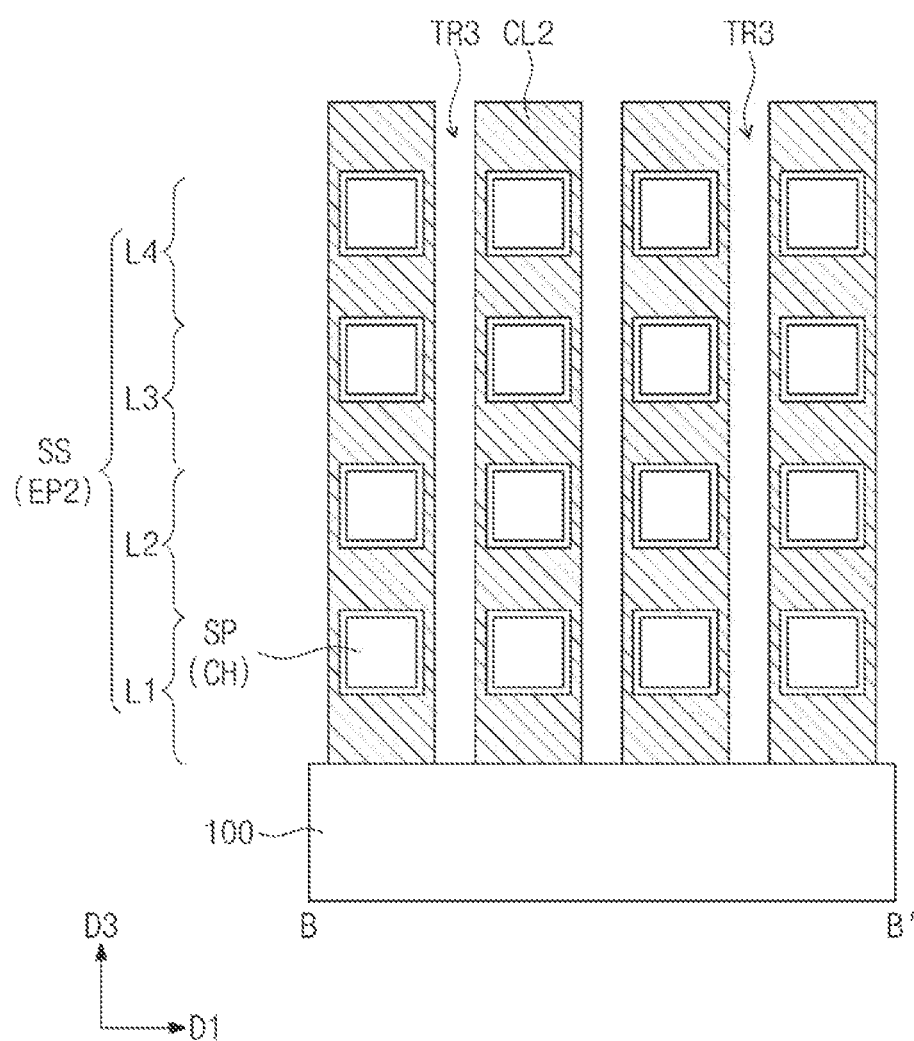
Figure 30C:
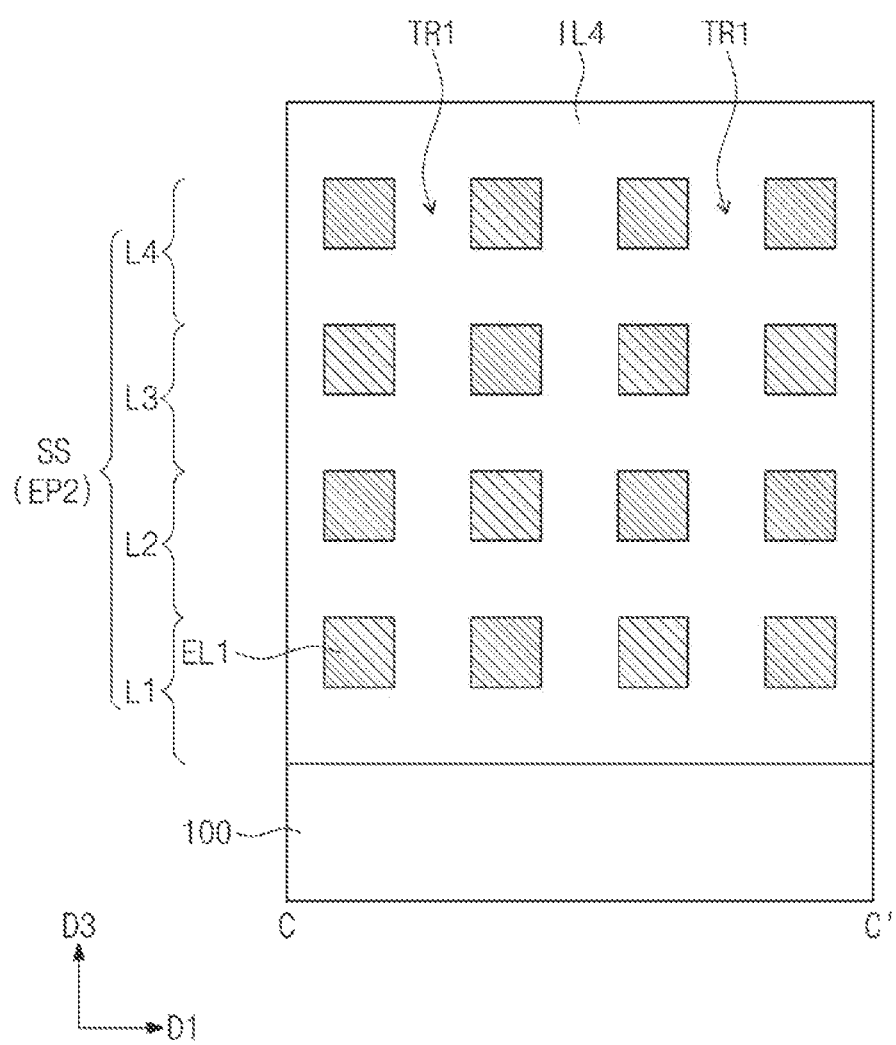
Figure 31:
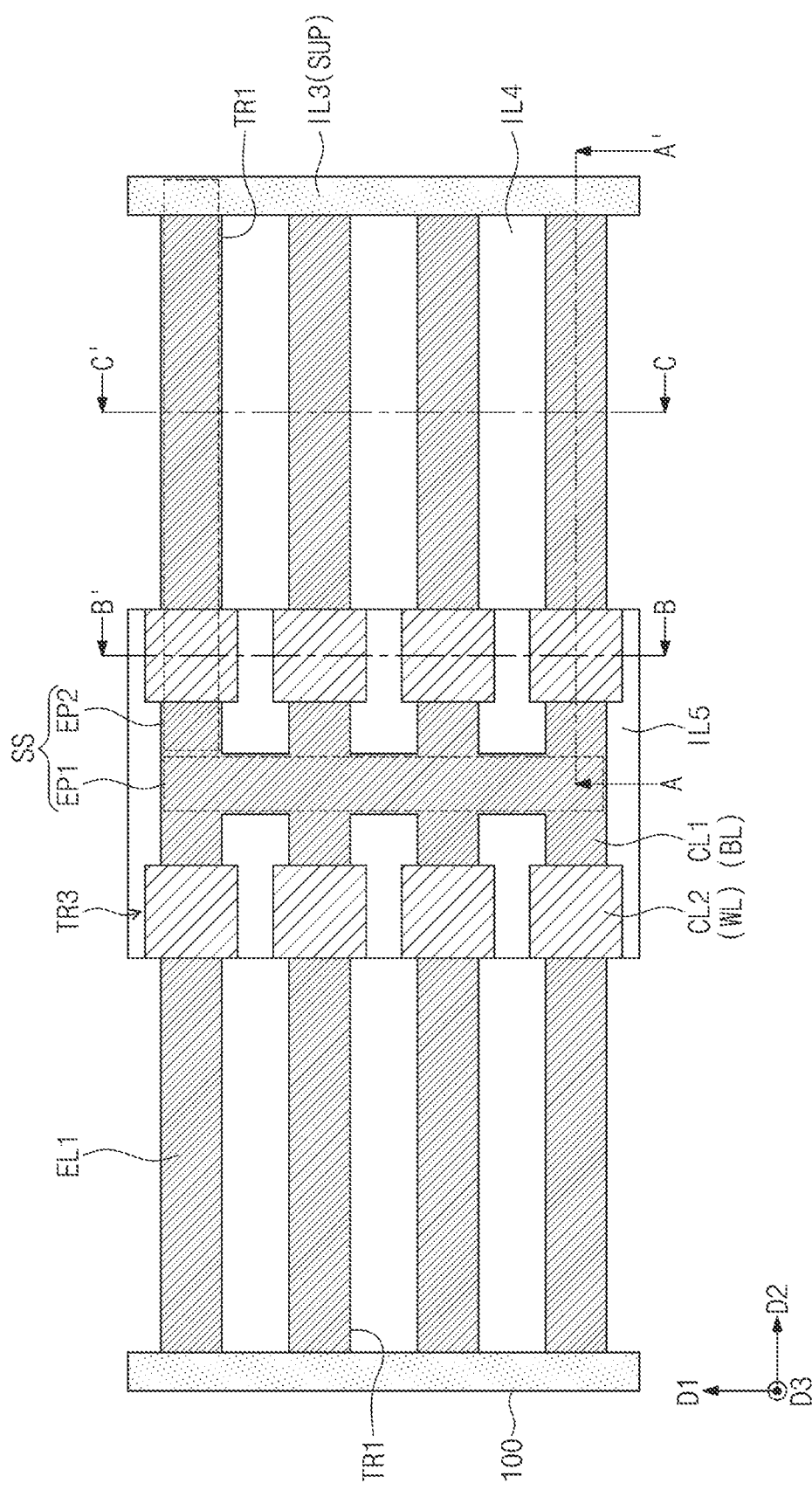
Figure 32A:
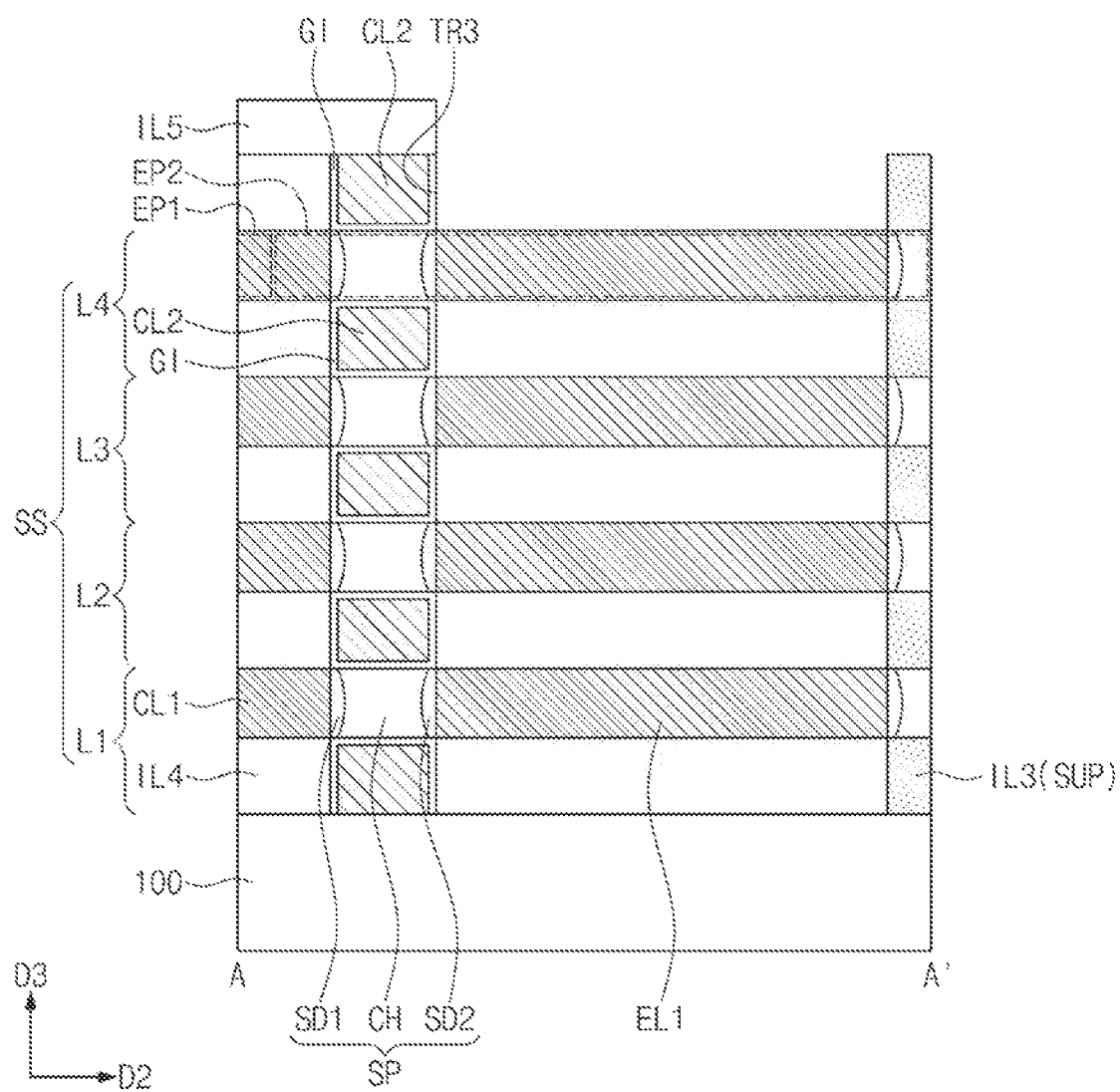
Figure 32B:
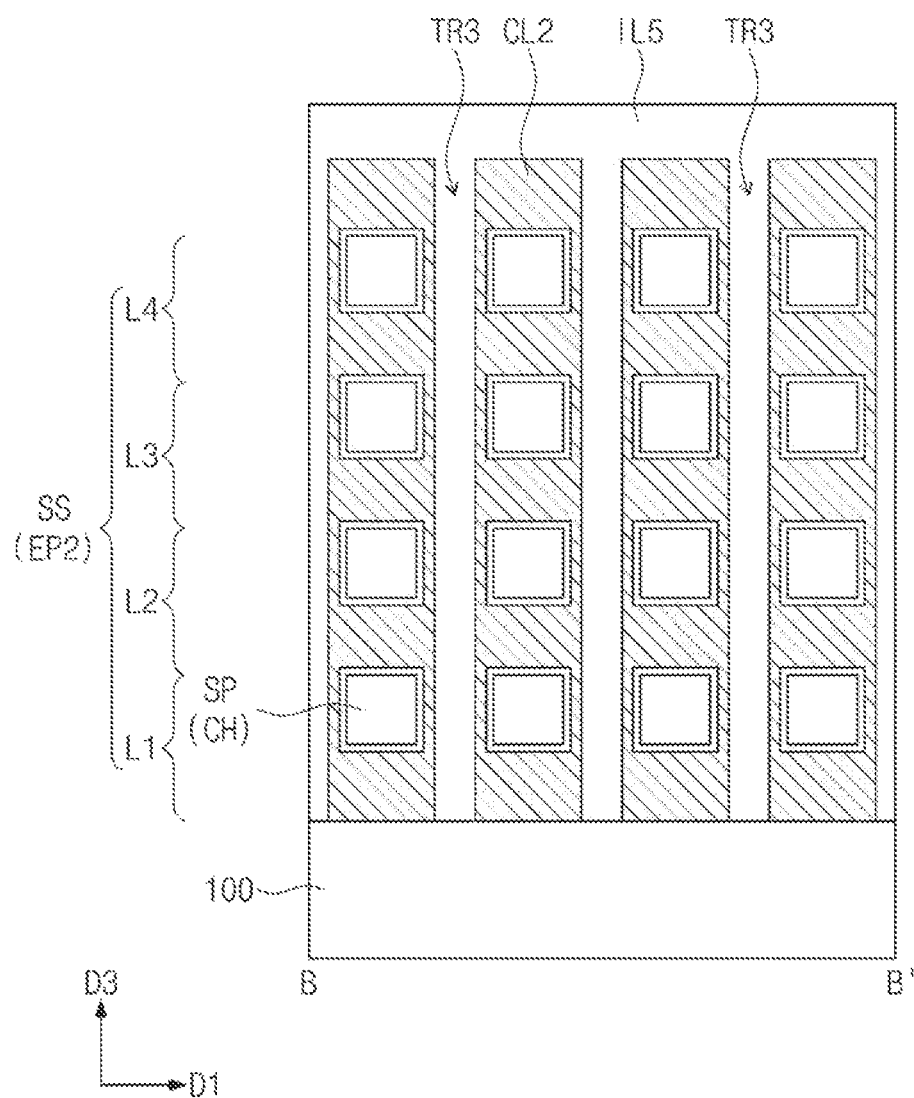
Figure 32C:
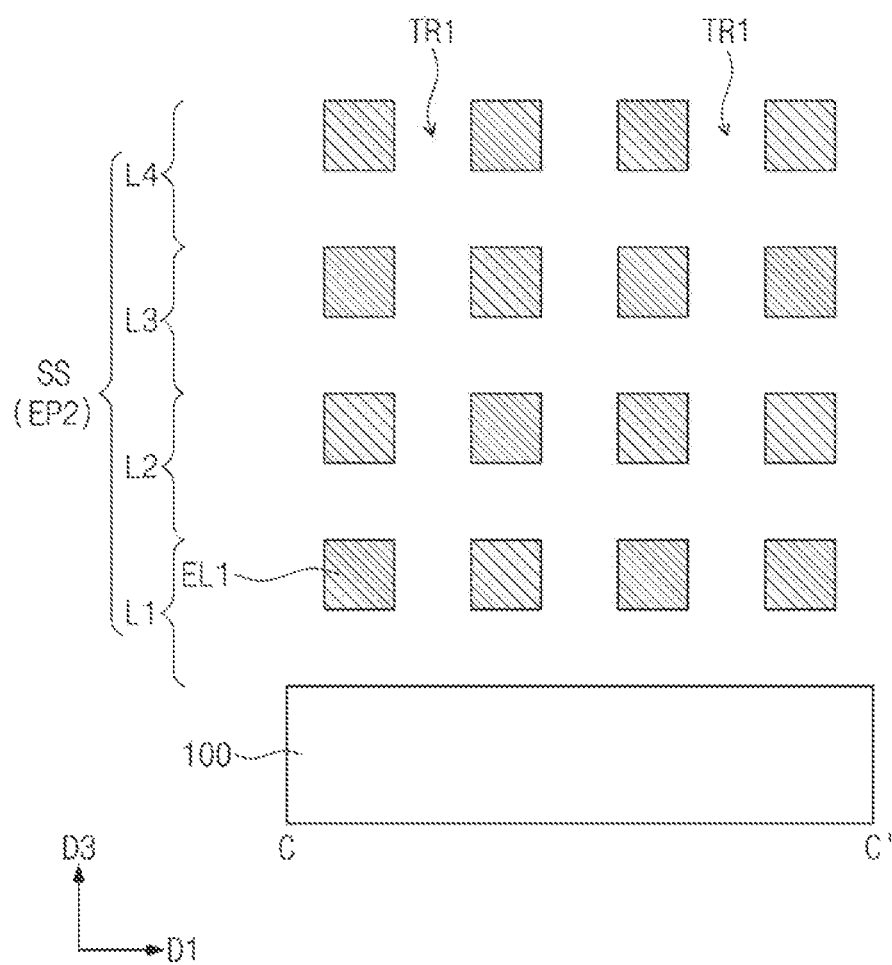

Referring to FIGS. 17, 18A, and 18B, a second insulating layer IL2 may be formed in (e.g., to fill) the first trenches TR1. The second insulating layer IL2 may be formed of or include an insulating material, which is the same as or different from the first insulating layer IL1. The second insulating layer IL2 may be formed of or include at least one of silicon oxide, silicon nitride, or silicon oxynitride. For example, the second insulating layer IL2 may include a silicon oxide layer.

Referring to FIGS. 19 and 20A to 20C, a second patterning process may be performed on the resulting structure provided with the second insulating layer IL2 to form second trenches TR2. The second trenches TR2 may be formed to extend in the first direction D1. For example, the second patterning process may include forming a second mask pattern with second openings, selectively etching the first insulating layers IL1 using the second mask pattern as an etch mask, and removing the second mask pattern.

During the second patterning process, the first insulating layers IL1 exposed by the second openings may be selectively removed to form the second trenches TR2. The semiconductor patterns SP of the stack SS may be partially exposed through the second trenches TR2, which are formed by partially and selectively removing the first insulating layers IL1.

Referring to FIGS. 21 and 22A to 22C, a third insulating layer IL3 may be formed in (e.g., to fill) the second trenches TR2. The third insulating layer IL3 may be formed of or include an insulating material having an etch selectivity with respect to the first and second insulating layers IL1 and IL2. The third insulating layer IL3 may be formed of or include at least one of silicon oxide, silicon nitride, or silicon oxynitride. For example, the third insulating layer IL3 may include a silicon nitride layer. Since the third insulating layer IL3 is formed in (e.g., to fill) the second trench TR2, the third insulating layer IL3 may be used to structurally support end portions of the second extended portions EP2 of the stack SS and/or may be used as the supporting layer SUP.

Referring to FIGS. 23 and 24A to 24C, the first and second insulating layers IL1 and IL2 may be selectively removed. The stack SS including the semiconductor layers SL and the third insulating layer IL3 may remain on the substrate 100.

Since the first and second insulating layers IL1 and IL2 are removed, the semiconductor layers SL may be exposed. An impurity doping process may be performed on the exposed surfaces of the semiconductor layers SL to form doped regions DR in the semiconductor layers SL. In a subsequent thermal treatment process, the doped impurities may be laterally diffused from the semiconductor layers SL, and in this case, a portion of the doped region DR may be overlapped by the third insulating layer IL3 in the third direction D3.

Referring to FIGS. 25 and 26A to 26C, the first conductive lines CL1 and the first electrodes EL1 may be formed by replacing the exposed portions of the semiconductor layers SL with a conductive material. In some embodiments, a silicidation process may be used to replace the exposed portions of the semiconductor layers SL with the conductive material. In the silicidation process, the exposed portions of the semiconductor layers SL may be reacted with a metallic material, thereby forming a metal-semiconductor compound (e.g., tungsten silicide, cobalt silicide, titanium silicide, and so forth). In some embodiments, the replacing of the semiconductor layers SL with the conductive material may include forming a metal nitride layer or a metal layer to conformally cover the exposed portions of the semiconductor layers SL.

During the replacing of the semiconductor layers SL, other portions of the semiconductor layers SL that are overlapped by (e.g., veiled with) the third insulating layer IL3 may be protected. In some embodiments, the overlapped/veiled portions of the semiconductor layers SL may constitute the semiconductor patterns SP. The channel region CH, the first impurity region SD1, and the second impurity region SD2 may be defined in each of the semiconductor patterns SP. The first and second impurity regions SD1 and SD2 may be remaining portions of the doped regions DR, which are not replaced with the conductive material in the replacing of the semiconductor layers SL. The channel region CH may be located between the first and second impurity regions SD1 and SD2.

Referring to FIGS. 27 and 28A to 28C, a fourth insulating layer IL4 may be formed on the substrate 100 in (e.g., to fill) empty spaces in the stack SS. The fourth insulating layer IL4 may be formed of or include an insulating material having an etch selectivity with respect to the third insulating layer IL3. The fourth insulating layer IL4 may be formed of or include at least one of silicon oxide, silicon nitride, or silicon oxynitride. For example, the fourth insulating layer IL4 may include a silicon oxide layer.

The third insulating layer IL3 may be selectively removed to form third trenches TR3. In some embodiments, the supporting layers SUP may not be removed during the formation of the third trenches TR3. The formation of the third trenches TR3 may include forming a third mask pattern having a third opening exposing the third insulating layer IL3, selectively etching the third insulating layer IL3 using the third mask pattern as an etch mask, and removing the third mask pattern. The third mask pattern may be formed on (e.g., to cover) the supporting layers SUP. After the formation of the third trenches TR3, the stack SS including the first conductive lines CL1, the semiconductor patterns SP, and the first electrodes EL1 and the fourth insulating layer IL4 may remain on the substrate 100.

Referring to FIGS. 29 and 30A to 30C, the gate insulating layers GI and the second conductive lines CL2 may be formed in the third trenches TR3. In detail, the gate insulating layers GI may be formed to conformally cover the semiconductor patterns SP exposed through the third trenches TR3. A conductive layer may be formed on the gate insulating layers GI to define a perimeter around (e.g., to surround a periphery of) the semiconductor patterns SP and then may be patterned to form the second conductive lines CL2. The second conductive lines CL2 may be formed to be spaced apart from each other in the first direction D1. The conductive layer may be formed of or include at least one of doped semiconductor materials, conductive metal nitrides, metals, or metal-semiconductor compounds. Each of the second conductive lines CL2 may be formed to define a perimeter around (e.g., to surround a periphery of) the semiconductor patterns SP, which are vertically stacked, and to extend in the third direction D3.

Referring to FIGS. 31 and 32A to 32C, a fifth insulating layer IL5 may be formed in (e.g., to fill) empty spaces in the third trenches TR3. The fifth insulating layer IL5 may be formed on (e.g., to cover) a top surface of the fourth insulating layer IL4. The fifth insulating layer IL5 may be formed of or include at least one of silicon oxide, silicon nitride, or silicon oxynitride. For example, the fifth insulating layer IL5 may include a silicon oxide layer.

A third patterning process may be performed to selectively expose the first electrodes EL1. For example, the third patterning process may include forming a fourth mask pattern having fourth openings, selectively etching the fourth and fifth insulating layers IL4 and IL5 using the fourth mask pattern as an etch mask, and removing the fourth mask pattern. The fourth openings may be formed to expose portions of the fifth insulating layer IL5 that overlap the first electrodes EL1.

Referring back to FIGS. 10 and 11A to 11C, the dielectric layer DL may be formed on (e.g., to conformally cover) the exposed surfaces of the first electrodes EL1. The second electrode EL2 may be formed on the dielectric layer DL to define a perimeter around (e.g., to surround a periphery of) the first electrodes EL1. Each of the first electrodes EL1, the dielectric layer DL, and the second electrode EL2 may constitute the capacitor DS. Moreover, as used herein, the words "surround a periphery of" are not limited to surrounding or covering every surface/side of an element. For example, a periphery of an element may include four sides/surfaces of the element, and does not necessarily include five or six sides/surfaces. As an example, a periphery may include a top surface, a bottom surface, and opposing side surfaces, and does not necessarily include end surfaces.

In a three-dimensional semiconductor memory device according to some embodiments of present inventive concepts, memory cell transistors and capacitors may be three-dimensionally arranged on a substrate. Accordingly, it is possible to increase an integration density of a memory device.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor memory device comprising:
    a substrate;
    a plurality of structures that are vertically spaced apart from each other in a stack on the substrate, wherein each of the plurality of structures respectively comprises:
        a semiconductor pattern that comprises a first impurity region, a channel region, and a second impurity region; and
        a first electrode of a capacitor that is connected to the second impurity region;
    a bit line extending vertically and connected to the first impurity region of the semiconductor pattern; and
    a word line including a first portion and a second portion that extend horizontally,
    wherein the first portion is on a top surface of the channel region of the semiconductor pattern, and
    wherein the second portion is on a bottom surface of the channel region of the semiconductor pattern.

2. The semiconductor memory device of claim 1,
    wherein each of the plurality of structures extends horizontally in a first direction that is parallel to a top surface of the substrate, and
    wherein the first and second portions of the word line extend in a second direction that crosses the first direction.

3. The semiconductor memory device of claim 2,
    wherein the semiconductor pattern and the first electrode comprise respective surfaces that are coplanar, and
    wherein the semiconductor pattern and the first electrode comprise respective extension axes that are parallel to the first direction and are coaxial.

4. The semiconductor memory device of claim 1,
    wherein the plurality of structures overlap each other in a vertical direction that is perpendicular to a top surface of the substrate, and
    wherein the bit line extends in the vertical direction and is connected to the plurality of structures.

5. The semiconductor memory device of claim 1, wherein the capacitor further comprises:
    a dielectric layer that is on the first electrode; and
    a second electrode that is on the dielectric layer.

6. The semiconductor memory device of claim 5,
    wherein the first electrode comprises one among a plurality of first electrodes of the plurality of structures,
    wherein the capacitor comprises one among a plurality of capacitors of the semiconductor memory device, and
    wherein the second electrode comprises a common electrode of the plurality of capacitors.

7. The semiconductor memory device of claim 1, further comprising a supporting layer that is connected to an end portion of the first electrode, wherein the supporting layer is configured to structurally support the plurality of structures.

8. A semiconductor memory device comprising:
    a substrate;
    a vertical stack comprising a plurality of layers on the substrate;
    a bit line extending in a vertical direction perpendicular to a top surface of the substrate; and
    a word line extending horizontally in a first direction parallel to the top surface of the substrate,
    wherein each of the plurality of layers of the vertical stack comprises:
        a semiconductor pattern that extends horizontally from the bit line in a second direction crossing the first direction; and
        a first electrode of a capacitor that is connected to the semiconductor pattern,
    wherein the semiconductor pattern of each of the plurality of layers includes a plurality of semiconductor patterns that are spaced apart from each other in the first direction, and
    wherein the word line includes:
    a first portion extending on top surfaces of the plurality of semiconductor patterns; and a second portion extending on bottom surfaces of the plurality of semiconductor patterns.

9. The semiconductor memory device of claim 8,
wherein the semiconductor pattern comprises a first impurity region, a second impurity region, and a channel region that is between the first impurity region and the second impurity region,
wherein the bit line is connected to the first impurity region, and
wherein the first electrode is connected to the second impurity region.

10. The semiconductor memory device of claim 8, further comprising a supporting layer that is configured to structurally support the plurality of layers,
wherein the capacitor further comprises:
a dielectric layer that is on the first electrode; and
a second electrode that is on the dielectric layer.

11. A semiconductor memory device comprising:
a substrate;
a plurality of memory cell transistors vertically stacked on the substrate, wherein each of the plurality of memory cell transistors includes a first source/drain region, a second source/drain region and a channel region therebetween;
a bit line connected to the first source/drain region of each of the plurality of memory cell transistors;
a word line connected to a gate electrode of at least one of the plurality of memory cell transistors; and
a data storage element connected to the second source/drain region of the at least one of the plurality of memory cell transistors,
wherein the data storage element comprises a first electrode that extends horizontally from the second source/drain region in a first direction parallel to a top surface of the substrate,
wherein the word line includes a first portion and a second portion that extend horizontally in a second direction intersecting the first direction,
wherein the bit line extends vertically in a third direction that is perpendicular to the top surface of the substrate,
wherein the first electrode extends longer in the first direction than in either of the second and third directions,
wherein the first and second portions of the word line extend longer in the second direction than in either of the first and third directions,
wherein the bit line extends longer in the third direction than in either of the first and second directions,
wherein the first portion is on a top surface of the channel region of the at least one of the plurality of memory cell transistors, and
wherein the second portion is on a bottom surface of the channel region of the at least one of the plurality of memory cell transistors.

12. The semiconductor memory device of claim 11,
wherein each of the plurality of memory cell transistors comprises a semiconductor pattern including the first source/drain region, the second source/drain region and the channel region, and
wherein the semiconductor pattern extends from the bit line in the first direction.

13. The semiconductor memory device of claim 12,
wherein the semiconductor pattern and the first electrode comprise respective surfaces that are coplanar, and
wherein the semiconductor pattern and the first electrode comprise respective extension axes that are parallel to the first direction and are coaxial.

14. The semiconductor memory device of claim 11,
wherein the data storage element comprises a capacitor that is adjacent to the word line, and
wherein the capacitor comprises the first electrode and further comprises:
a dielectric layer on the first electrode; and
a second electrode on the dielectric layer.

* * * * *